United States Patent [19]

Labit et al.

[11] Patent Number: 4,845,559
[45] Date of Patent: Jul. 4, 1989

[54] PROCESS AND APPARATUS FOR DIGITAL SIGNAL CODING AND TRANSMISSION BY SELECTIVE REPLENISHMENT IN TIME OF A VECTOR QUANTIZER

[76] Inventors: Claude Labit, 6, Square du Coloniel Remy, Rennes 35700, France; Jean-Pierre Marescq, Route de Coutances, Teriers 50190, France

[21] Appl. No.: 134,037

[22] Filed: Dec. 17, 1987

[30] Foreign Application Priority Data

Dec. 17, 1986 [FR] France ............................... 86 17715

[51] Int. Cl.[4] ............................................. H04N 7/12
[52] U.S. Cl. .................................... 358/133; 358/135; 375/122
[58] Field of Search ....................... 358/136, 133, 135; 375/122

[56] References Cited

U.S. PATENT DOCUMENTS 4,371,895 2/1983 Kaga .................................... 358/136

4,670,851 6/1987 Murakami et al. ............. 358/136 X

Primary Examiner—Edward L. Coles, Sr.
Assistant Examiner—Victor R. Kostak
Attorney, Agent, or Firm—Kenyon & Kenyon

[57] ABSTRACT

A data compression process and apparatus using adaptive coding of a digital signal by vector quantization being applicable to transmission of digital audio signals and digital television signals as well as other signals. Quality of the received signal under the constraint of limited transmission bit rate is improved by selective optimized local replenishment of the code-book. Selected high distortion cells are identified using the current code-book and the partitioning of the selected cells reconfigured interdependently with reconfiguration of the neighboring cells to replenish the code-book, and replenishment data transmitted to the receiver. The preferred vector quantization includes classification of the cells according to distortion criteria, the code-book being a concatenation of subcode-books which are separately replenished.

15 Claims, 18 Drawing Sheets

FIG. 6
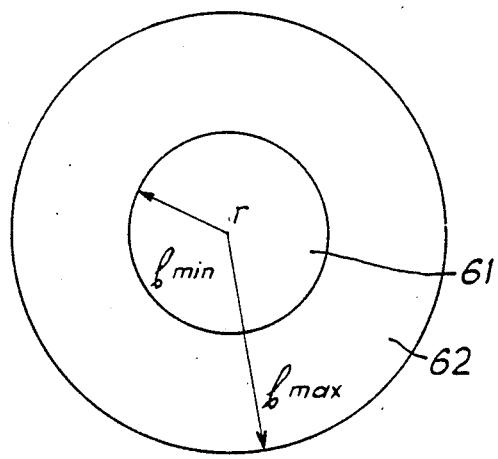
FIG. 6 Bis
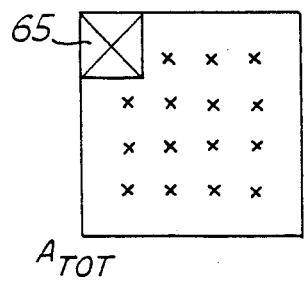
$A_{TOT}$
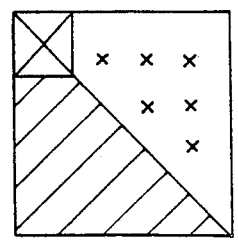
$A_{UPP}$
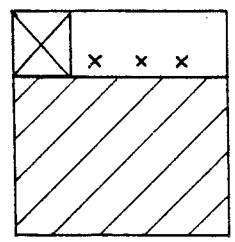
$A_{LIN}$
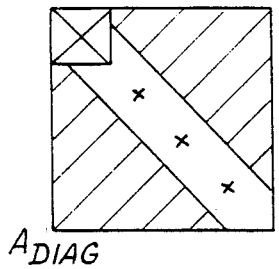
$A_{DIAG}$
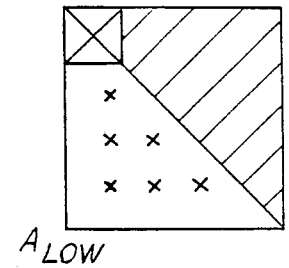
$A_{LOW}$
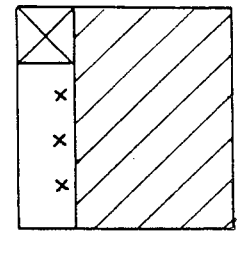
$A$

PROCESS AND APPARATUS FOR DIGITAL SIGNAL CODING AND TRANSMISSION BY SELECTIVE REPLENISHMENT IN TIME OF A VECTOR QUANTIZER

BACKGROUND OF THE INVENTION

This invention relates to a process and apparatus for coding and transmission of digital signals using data compression techniques. The invention is applicable to coding operations of image signals, such as digital television signals, but is also applicable to audio or other digital signals.

More specifically, the invention relates to coding and transmission operations in which the data compression is achieved using vector quantization.

In fact, data compression techniques have the objective of reducing the bit rate of information to be transmitted by coding which eliminates redundancies in the digital signal to be transmitted while observing a certain constraint of quality for the received signal.

The technique of vector quantization meets this objective by substituting for each component of the digital input signal, represented in the form of a vector of M variables, a representative vector chosen from a predefined and limited set of vectors. More exactly, the space formed by the set of possible vectors for the digital input signal is partitioned into a reduced number of cells each grouping a plurality of vectors and therefore a plurality of possible input signal states. All the vectors of the same cell are then systematically represented by single "representative" vector for the cell. The digital signal actually transmitted is thus limited to a succession of representative vectors, preferably each coded by a label i.

This technique thus indeed does achieve compression of the digital input signal, by empowerishing the transmitted information. In the case of transmission of a digital audio or television signal, a big reduction in the information bit rate can be achieved without affecting the psycho-auditive or psycho-visual sensitivty of the receiver.

Of course, the operation of the system requires the receiver to be able to decode the transmitted signal, that is to say recover the characteristics of the representative vector corresponding to each label i received. This decoding function is performed using a look-up table indicating the corresponding label/representative vector called a code-book. To enable real-time decoding of the transmitted signal, the code-book must be previously transmitted to the receiver, before transmission of the useful digital signal.

The performances of these known techniques of coding depend on the way of generating the code-book and, more exactly, on the process of partitioning and then on the choice of the representative for each cell.

DESCRIPTION OF THE PRIOR ART

A known partitioning process comprises predefining the cells within the set of all possible states which the vectors of the input signal can adopt. This type of non-adaptive coding is particularly described by L. FORTIER in a report of INRS entitled "Quantification vectorielle du signal monochrome" (Vector quantization of monochrome signals) Quebec University, July 1984. This method of generation presents at least two major disadvantages, relating to the constraints on the generation of the code-book and to the precision of the quantization achieved.

In fact, in order to obtain good image quality from the received signal, it is necessary to generate a large code-book which requires long times of generation and transmission. Moreover, such a code-book can only be generated reliably and rapidly from a digital input signal if the signal is stationary and ergodic.

Concerning the precision of coding, unless a very voluminous code-book is used with the disadvantages stressed above, non-negligable distortion of the signal is observed, particularly to low bit rates. The precision of quantization is fixed from the start and the code-book is insufficiently robust to code images.

To avoid these disadvantages of non-adaptive techniques, it has also been proposed to make the partitioning more flexible by permitting re-definition of the cells as a function of the instantaneous digital input signal. Among the more sophisticated adaptive processes is a principle described by A. GERSHO and M. YANO in the article "Adaptive Vector Quantization by Progressive Code-Vector Replacement" published in 1985 in the IEEE review. The authors described a process for updating the code-book (replenishment) for encoding successive image portions by modifying the representative or even the partition when the partial mean distortion of the cell exceeds a pre-defined threshold. The modification of partitioning consists, if required, of splitting a cell in two or eliminating a little-used representative to maintain the bit rate constant.

However, in order to be effective, this local re-arrangement needs the variation of the statistics over several adaption intervals to be slow, in order to avoid too large an additional data flow and to keep the replenished code-book close to the optimum code-book in each interval. Another disadvantage of this adaptive method is linked to the fact the local replenishment of the code-book does not really achieve a reconfiguration of the partitioning. The replenishments are performed independently for each cell without any process of spreading the up-date onto adjacent cells. This rigidity results in inadequate partitioning, leading to cells which are ill-suited and sometimes redundant or not useful for a given distortion level.

Besides the delicate problem of suitability of the partitioning to the digital input signal under the constraint of information bit-rate, the problem also arises of choosing a suitable representation for each cell.

According to the principle of vector quantization, the choice of the representative is made by minimizing the mean distortion over the vectors of the cell. This condition is usually expressed by relating the distortions to the Euclidean distance between vectors. However, although this measure of distortion has merit readily being expressed analytically, it does not reproduce faithfully the subjective measures of distortion due to visual perception.

OBJECTS OF THE INVENTION

An object of the present invention is to provide an adaptive coding technique for a digital signal which avoids some or all of the above disadvantages.

A more specific object of the invention is to provide a technique of adaptive coding of a digital signal by vector quantization comprising a process of selective replenishment of the code-book, taking account of the influence of the reconfiguration of each cell on its immediate environment. In other words, an objective is to introduce a flexibility and adaptability of the replenishment to avoid the reconfiguration of one cell introducing, as a side-effect, distortions or parasitic redundancies relative to its immediate environment.

Another object of the invention is to provide a coding technique which fulfills the above objective while minimising the information bit rate required to transmit the coded signal. In fact, an objective of one application of the invention, among the many other possible applications, is to use the coding technique for the transmission of digital television image signals whose sampling frequency is currently standardised at 13.5 MHZ.

A complementary object of the invention is to provide a coding technique which is compatible with grouping the components of the transmitted signal according to a classification by type, each class corresponding to a specific processing mode and specific sampling possibilities. The grouping by class must then be accompanied by the creation of independent sub-code-books corresponding to each class; a careful choice of classification must enable the representatives to be grouped in the same classes which are suitable for zone sampling in such a way as to minimize the size of the corresponding code-book and reduce the information bit rate during transmission of the coded signal. In the case of application of the invention to a digital television signal, the classes can be defined in such a way as to group together the types of components (image blocks) of the coded signal which can be heavily zone sampled, such zones being defined observing a threshold of psycho-visual perception.

Yet another object of the invention is to provide such an adaptive coding technique which is also usable for coding interlaced frame images.

A general object of the invention is to provide a process of, and apparatus for, coding or decoding signals and transmitting coded signals, with high image quality and restricted information transmission bit rate.

SUMMARY OF THE INVENTION

The present invention provides a process for adaptive coding of a digital signal by vector quantization, to produce high quality of the coded signal under the constraint of a limited information bit rate, comprising partitioning into cells the space of possible states of the components of the signal, choosing a single representative for each cell, substituting for each component of the signal the representative of the cell to which it belongs, the set of representative resulting from the partitioning forming a code-book, and locally replenishing the code-book, the replenishment comprising at least the following steps:

selecting cells for which coding of the new set of signal components using the current code-book produces a distortion exceeding a certain threshold;

exploring the content and occurrence of use of the code-book using the new set of signal components in each cell thus selected and in the neighbourhood of said selected cell constituted of at least one neighbouring cell of said selected cell, and reconfiguring the legal partition of said neighbourhood considered as a set of interdependent cells by defining one or more new representatives for said set of interdependent cells.

Preferably, said step of exploring and reconfiguring the neighbourhood of the selected cell comprises distinguishing a very close neighbourhood (immediate proximity) and a close neighbourhood (simple proximity), and merging all the cells in said very close neighbourhood with re-calculation of the new common representative, then replenishing interdependently all the cells of said close neighbourhood, including the merged cell.

Advantageously, said interdependent replenishment of all the cells of the close neighbourhood, including the merged cell is performed using an LBG algorithm and/or techniques of splitting the cells.

In a preferred embodiment of the invention, said vector quantization is multi-class, said code-book comprising a concatenation of sub-code-books corresponding to respective classes, and replenishment of the code-book being performed separately for each sub-code-book.

The invention also provides a process for transmitting a digital signal comprising coding the signal by a process as described above, transmitting an initial code-book prior to transmitting a useful signal, memorizing said initial code-book at the receiver, periodically replenishing said code-book using at least certain of the new sequences of the digital input signal and, after each periodic replenishment, transmitting selectively to the receiving the information for replenishment of the receiver code-book.

The invention also includes a process applied to the transmission of digital television image signals, wherein said code-book is replenished for each new image signal frame, said replenishment information being transmitted prior to the transmission of the image information for the corresponding frame.

Advantageously, said initial code-book is transmitted in the form of the values of each representative accompanied by a label addressing the representative in the code-book, transmission of each coded sequence of the useful signal comprising transmitting the label of the representative of each component of the useful signal, and the transmission of replenishment information comprising the transmission of the new representative accompanied by their labels addressing them in the code-book.

Preferably, the transmission of the replenishment information also comprises transmitting the labels of eliminated representatives.

BRIEF DESCRIPTION OF THE DRAWINGS

Other features and advantages of the invention will appear from the following description of a preferred embodiment thereof, applied to digital television by way of illustration, with reference to the accompanying drawings, in which:

FIG. 6 is a diagrammatic view of a cell in vector space, illustrating its reconfiguration in interdependence with its close neighbourhood in the replenishment process of FIG. 5;

FIG. 6B is a schematic view of part of the image showing sets of grids for classification of transformed image blocks subjected to the adaptive encoding process of FIG. 3;

FIGS. 8, 9, 10, 10B and 11 are synoptic diagrams showing details of the chains of circuits and modules corresponding to respective parts of the apparatus of FIG. 7;

DETAILED DESCRIPTION

Figure 1:
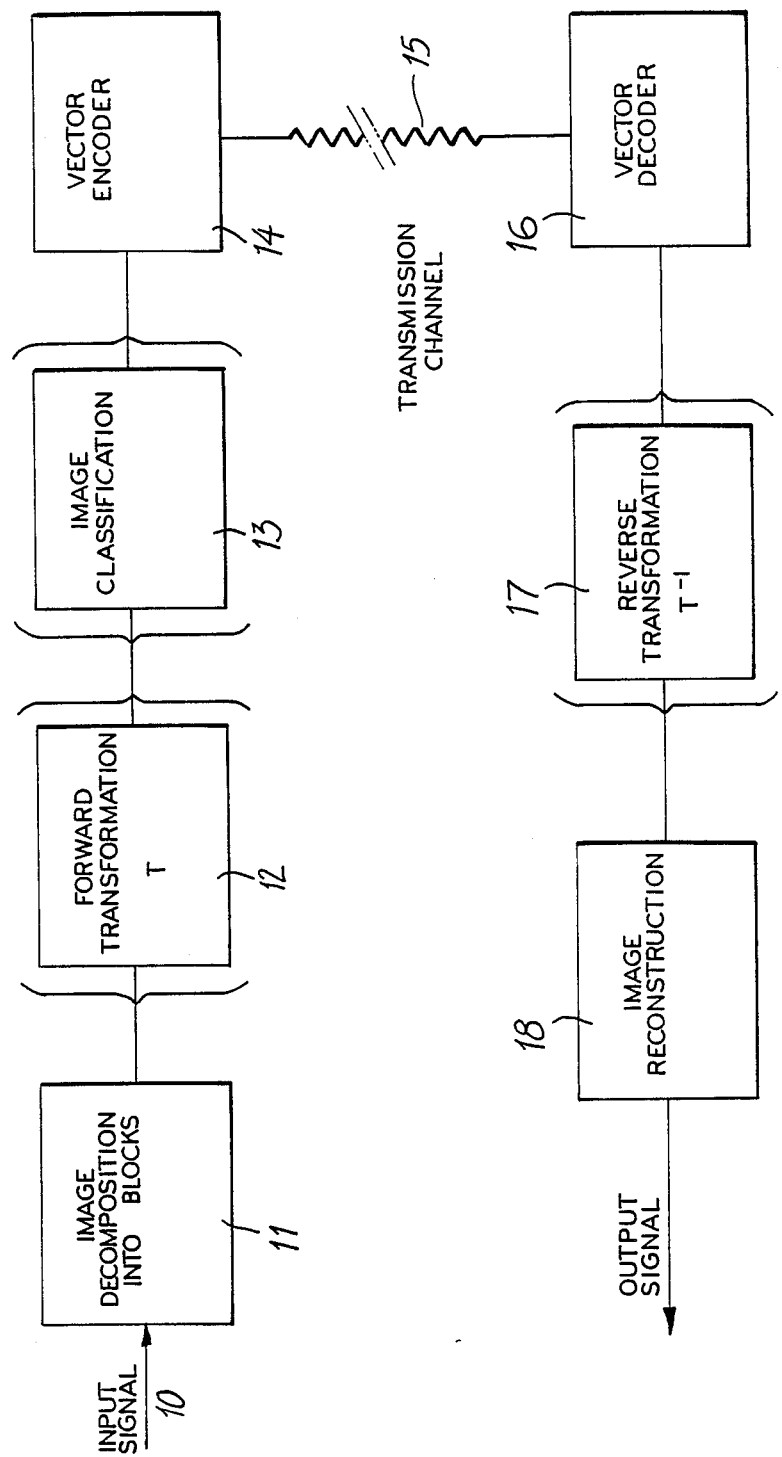
FIG. 1 is a schematic diagram showing the encoding-decoding process for the digital image signal using vector quantization.

FIG. 1 shows schematically an encoding-decoding process for digital imager signals. The diagram enables the outline of an embodiment of an adaptive coding process in accordance with the invention to be followed, and this embodiment will now be described.

Although the following description refers systematically and specifically to coding and transmission of images, especially television images, it will be appreciated that the coding process is applicable to coding operations on other types of signals.

In the general process shown in FIG. 1, the input signal 10 is an image signal which is first decomposed, at 11, in suitable manner, into image blocks, for example into blocks of 4×4 pixels. Each image block forms one component of the input signal 10.

The decomposition of the image into 4×4 pixel blocks is not essential for the image encoding. However, this decomposition is very advantageous, to the extent that a smaller block size increases the bit rate for a given code-book size and a larger block size does not enable simple configurations of blocks to be isolated really and considerably increases the times for generation of the code-book and of search for codewords.

The image blocks may be considered as vectors whose components are the characteristics of each of the pixels of the image block. The characteristics of the pixels are, for example, the intensity alone in the case of a monochrome image or may be the luminance or the chrominance in the case of a colour image signal.

The case described below is the specific case of a monochrome image signal.

The image blocks may next be subjected to a pre-proceeding 12 before encoding.

The pre-processing 12 comprises an orthogonal transformation, which consists of associating with each iamge block a transformed block of the same dimensions, representative of the frequency components of the original block. Each transformed block is a vector, one of whose coefficients is proportional to the mean of the intensities in the block and the other coefficients providing frequency information.

The advantages of proceeding by transformation are, in particular, that the vector components are decorrelated, the effect of averaging due to the vector quantization is reduced, or, as shown below, the coded block is sampled by zones to reduce the transmission bit rate.

Orthogonal transformations which are available are Slant, Hadamard, Cosine Transforms. The Cosine Transform is the best suited to the image signal characteristics.

Classification pre-processing 13 of the image blocks enables the blocks to be separated by type, for example to subject them to independent (parallel) processing specifically suited to each class.

Examples of classification of the transformed coefficient blocks separate the blocks into : homogeneous blocks, horizontal or vertical contour blocks and noisy or non-noisy textures, among others.

In the coding process of this embodiment of the partial bit rate of each class to be modulated without penalizing the others, by adapting as closely as possible to the sensitivity of the visual system, which is different for different block configurations. By calculating a code-book for each of the classes defined, two other worthwhile effects are added : the averaging effect is reduced, which gives a better visual rendering and the calculation cost is less than in the case of global image processing.

After the pre-processing steps 12, 13, which may also include other processing steps, not described, the digital input signal is then formed of doublets : $(V_k, n_k)$, where $V_k$ is the kth vector of the input signal and $n_k$ is the number of the class to which the vector $V_k$ belongs. This is the flow of data in time which will be considered as the input in the embodiment described. below.

The doublets $(V_k, n_k)$ are processed by vector quantization in a vector encoder 14. As mentioned above, the vector quantization enables compression of the data to be transmitted over the channel 15. Thus, each vector is transmitted simply in the form of the label of the rang of its representively (or code word) in the code-book.

On reception of the coded signal, the reverse operations of decoding 16, reverse transformation 17 and image reconstruction 18 are performed. Decoding 16 requires previous transmission of the code-book.

One of the important advantages of the encoding-decoding process shown in FIG. 1 is that, whatever the complexity of the encoding operation performed upstream of the transmission channel 15, the receiver unit 16, 17, 18 is very light : the complex part of the decoding is in fact concentrated in the code-book, whose transmission and storage are not major constraints from the point of view of the receiver unit.

Figure 2:
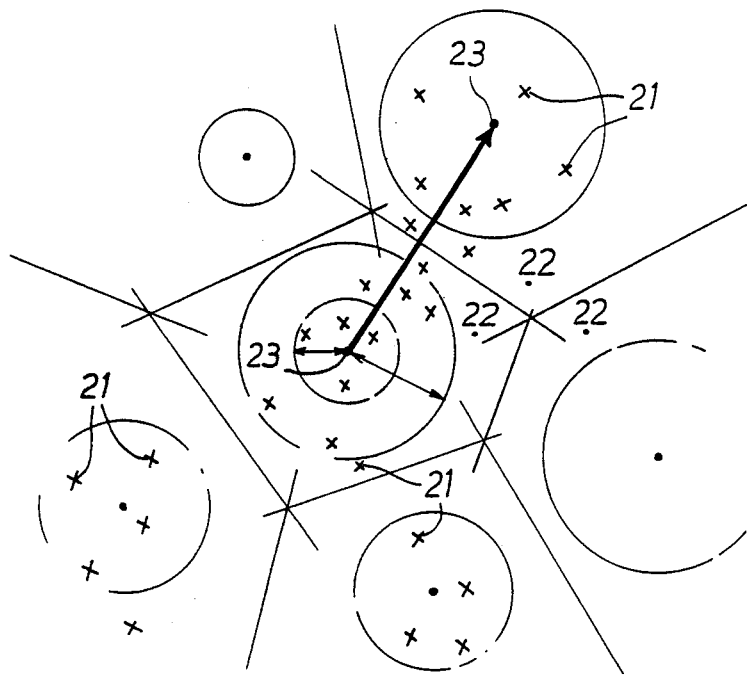
FIG. 2 is a diagrammatic partial view of vector space illustrating the principle of partitioning by vector quantization of a two-dimensional space.

FIG. 2 illustrates the partitioning of the space of the possible vector states (transformed image blocks) by vector quantization. Although the partitioning shown in FIG. 2 is indicated schematically in a two dimensional space, it will be understood that the vector quantization of the encoder 14 of FIG. 1 acts in M dimensions, M representing the cardinal of each vector.

As shown in FIG. 2, the partitioning consists of separating the vectors 21 into cells 22, each centred about a representative vector 23. The construction of the cells 22 is performed according to a rule of minimization of distortion resulting from the substitution of the representative 23 for each vector 21 of the cell. The calculation of distortion is typically a calculation of the Euclidean distance between each vector and its representative 23.

The introduction of a classification into the adaptive coding of the embodiment of the invention enables the acceptable threshold of distortion to be modulated for the specific generation of the sub-code-book for each class.

Figure 3:
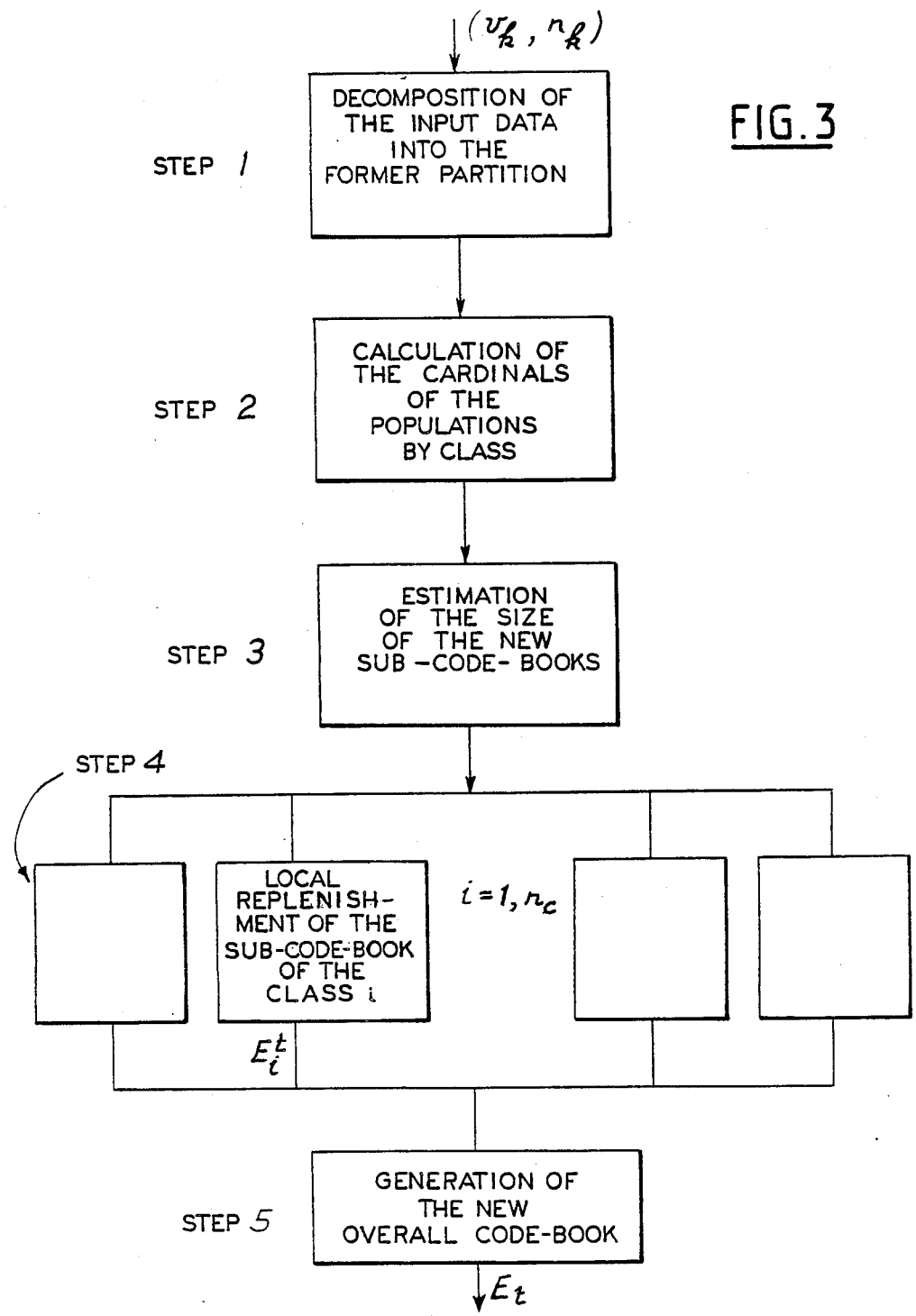
FIG. 3 is a functional diagram showing the preferred sequencing of the steps of an encoding process in accordance with an embodiment of the invention.

FIG. 3 shows diagrammatically a preferred sequence of the code-book replenishment steps in this embodiment of the invention:

step 1 consists of accepting an observation set of vectors ($V_k$, $n_k$) intended to test the current code-book $E_{t-1}$. This observation set of vectors may be formed by the whole of the new image or the new frame to be transmitted. However, the observation set may be formed only by a sample of the new image, provided that the corresponding signals are stationary and ergodic.

steps 2 and 3 are essentially the estimation of the size of the new sub-code-books, by calculation of the cardinals of the populations by class. In other words, the process illustrated in FIG. 3 begins by counting the occurence of usage of each sub-code-book by the observation sequence of vectors.

When replenishment of the code-book is subjected to a constraint as to the maximum size of the code-book, the estimation of the size of each of the new sub-code-books enables the approximate number of representatives that they will have to contain to be forecast for each of them.

steps 2, 3 and 5 of FIG. 3 are not essential steps in the invention. They may be omitted in the absence of constraints on the final size of the concatenated code-book, or replaced by any other suitable algorithm.

step 4 corresponds to the selective replenishment of the sub-code-books $E_i^t$, performed independently for each class i. This step is explained in more detail in FIG. 5.

step 5 is the final step and consists in concatenating all the replenished sub-code-books from step 4 to obtain the new overall code-book $E_t$.

Figure 4:
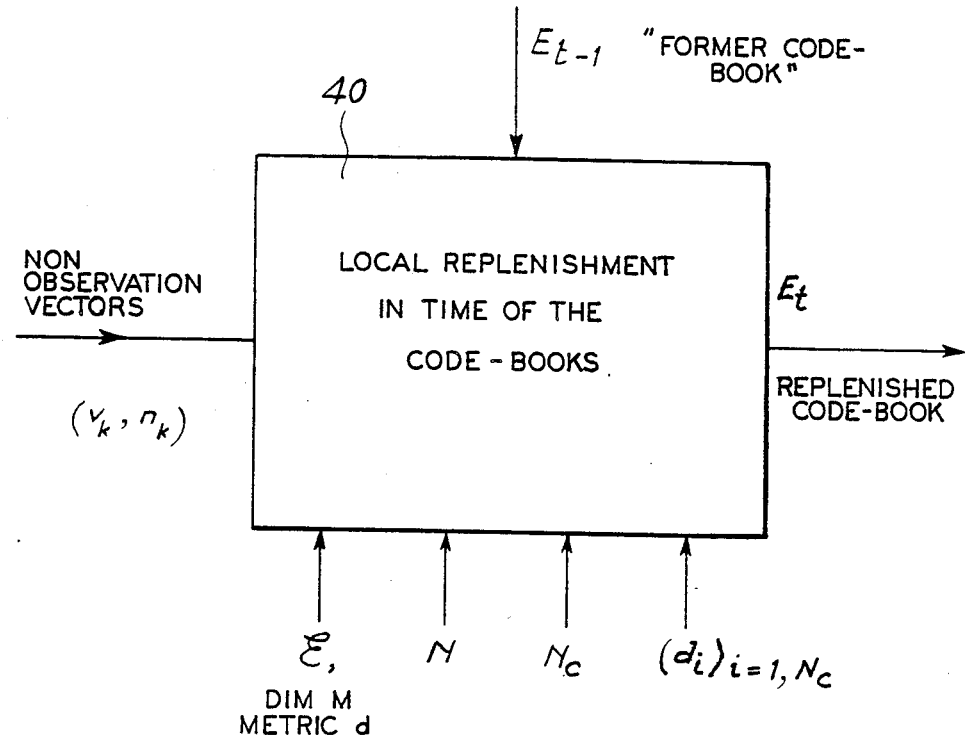
FIG. 4 is a diagram showing the operational parameters used in the encoding process.

The operation of replenishing the code-book is summarized in FIG. 4.

The main input of the replenishment system 40 is the former code-book $E_{t-1}$ and the output is the replenished code-book $E_t$.

The replenishment parameters are the following:
the observation set of vectors ($V_k$, $n_k$);
the working vector space $\epsilon$ of dimension M provided with a metric d;
the size of the overall code-book N;
the number of classes, and hence of sub-code-book, $N_c$;
the maximum acceptable distortion for each class $d_i$.

The prior determination of the maximum acceptable distortions per class is preferably performed on the basis of psycho-visual criteria.

Figure 5:
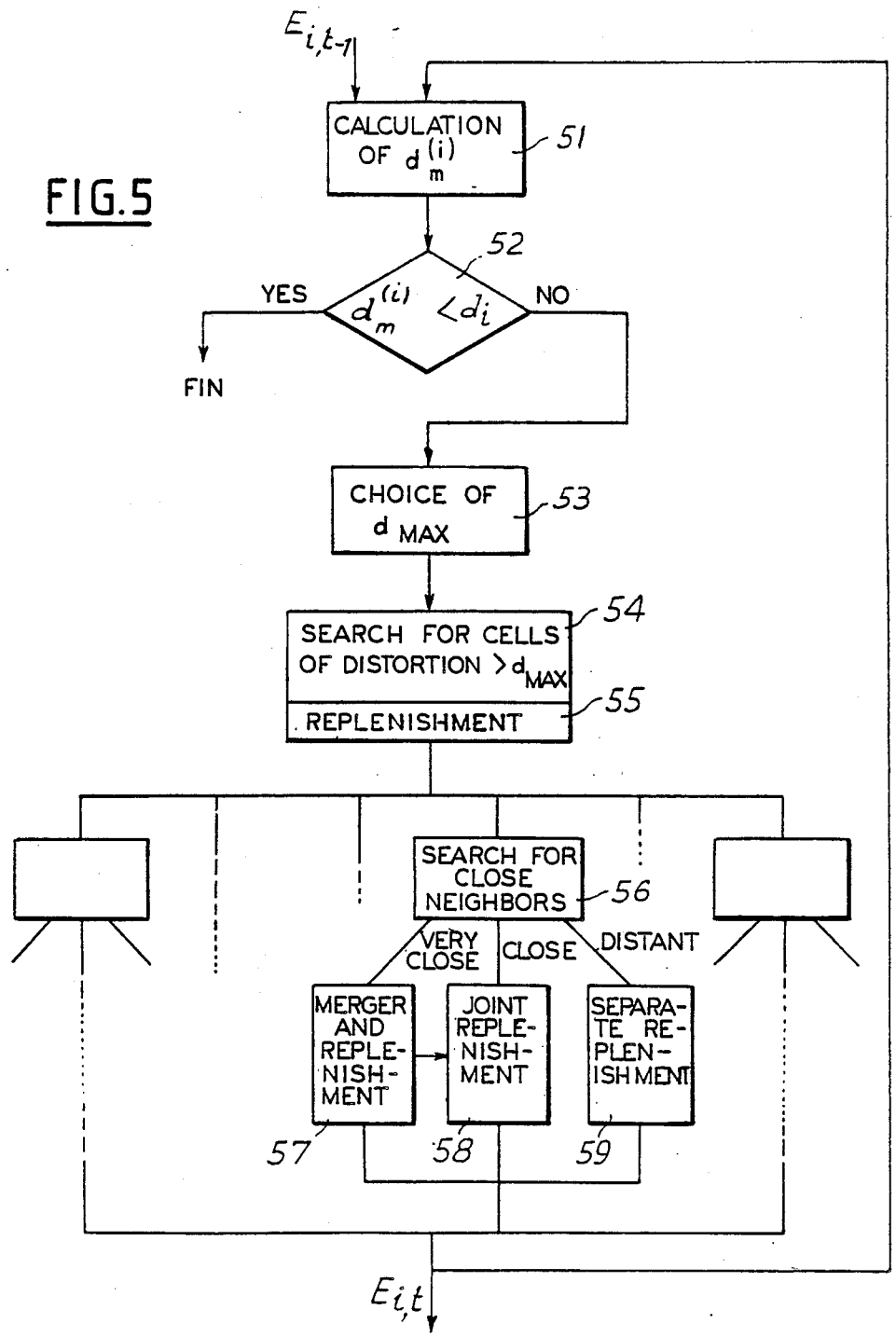
FIG. 5 is a logic chart of the sequential presentation of a local replenishment process of a sub-code-book in step 4 shown in FIG. 3.

FIG. 5 shows the logic chart of a preferred embodiment of the selective replenishment process for each sub-code-book. This process corresponds to one of the parallel processes of step 4 of FIG. 3.

It will be appreciated that, in the absence of classification, the replenishment process of FIG. 5 is applied uniformly to the whole code-book.

The selectivity of the replenishment is an important feature of this embodiment of the present invention. This selectivity is ensured, in the embodiment of FIG. 5 through the intermediary of a test 52 on the mean distortion of the sub-code-book then, if necessary by performing a second test 54 intended to replenish high distortion cells so as to reduce the mean distortion of the sub-code-book.

Essentially, replenishment of the selected cells is performed in inter-dependence with its neighbourhood 56.

Test 52 requires previous calculation 51 of the mean distortion $d^{(i)}_{moy}$, calculated on the previous sub-code-book $E_{i,t-1}$, using the vectors of the observation set belonging to class i.

When the mean distortion of the sub-code-book is less than the maximum acceptable distortion $d_i$, no replenishment is undertaken.

Otherwise, selection of the high distortion cells is performed after having chosen a maximum acceptable distortion value $d_{max}$ for each cell. Preferably, $d_{max} = \lambda_i d_i$, the coefficient $\lambda_i$ being assigned decreasing values by recursivity if the mean distortion $d^{(i)}_{moy}$ does not come back under the maximum acceptable threshold $d_i$ during the first iteration.

In step 54, the selection of the cells whose distortion is greater than $d_{max}$ is first subjected to a first replenishment 55 by recalculating each centroid (representative) of these cells. The displacement of the representative within the cell relative to its initial position is all the more important since the topology of the new vectors of the observation set differs from that of the previous observation vectors.

When the selected cells have undergone a first replenishment 55, the process of this embodiment of the invention ensures an exploration of the neighbourhood of the replenished cell in order to obtain a new local partitioning. One feature of this embodiment of the invention is that each replenished cell is "re-inserted" locally to avoid the distortions which would result indirectly from the replenishment 55.

Advantageously, three levels of proximity are distinguished, namely immediate proximity 57, simple proximity 58 and distant proximity 59. This distinction enables smoothing of the effect of replenishment of the selected cell on its neighbourhood, by merger of the selected cell with cells of its very close neighbourhood, and then re-partitioning interdependently the new merged cell with all the close cells. The distant neighbourhood is not taken into account.

FIG. 6 illustrates the principle of exploring the neighbourhood of each selected cell. The method shown consists of searching for the P closest representatives neighbouring on the representative r of the selected cell in the sphere included in the space $\epsilon$ centered on the representative r and of radius f, which is a function of the maximum acceptable distortion $d_i$. Advantageously, a limit is placed on the number of representatives searched: $P \leq P_{max}$.

The P closest representatives of the replenished representative r can be separated into:

$P_1$ representatives identified in the immediate neighbourhood 61: sphere of radius equal to fmin.;

$P_2$ representatives identified in the close neighbourhood 62: sphere of radius equal to fmax.

The replenishment strategies are defined as a function of the degree of neighbourhood. In the immediate neighbourhood, all the cells identified are merged, with replenishment by recalculation of the centroid for the merged set.

The replenishment technique used next for the close neighbourhood 62, including the merged cell, is the use of an algorithm such as the Linde, Buzo and Gray ("LBG") algorithm, and clipper techniques. The LBG algorithm is a technique for iterative optimization of a code-book for a given distortion criterion, for example $d_{max}$. The splitter techniques aim at doubling up an initial cell, particularly when the mean distortion of the cell exceeds a certain acceptable threshold.

If the neighbourhood of the selected is empty ($P=P_1=P_2=0$) the LBG algorithm and splitter techniques may also be used to optimise the merged cell.

When all the selected and replenished cells after steps 54, 55 have been re-partitioned in interdependence with their neighbourhood 57, 57, 58, 59 and the mean distortion of the sub-code-book is below the maximum threshold i, the replenishment of the sub-code-book is finished.

An example of an application of the process of the embodiment of the invention can be summarised in the sequence of phases 1 to 9 shown in table 1.

TABLE 1

Example of sequencing of logic phases applying the described process for replenishment of a sub-code-book.

Phase 1: current code-book: code-book of the previous frame
  Distribution of the vectors which come from the frame to be enclosed and calculation of the mean distortion $D_m$.
  If $D_m \leq$ acceptable threshold, no replenishment
  Otherwise continue
Phase 2: Fix a threshold $D_{cell\ max}$ of maximum acceptable distortion per cell.
Phase 3: Replenish all cells whose distortion is greater than $D_{cell\ max}$
Phase 4: For each representative replenished but not yet processed.
  Search for the closest representative and
  Calculate the distance $D_{neigh}$ between the two representatives
  If $D_{neigh} \geq D_m$, perform Phase 5
  If $D_m < D_{neigh} \leq 2,5\ D_m$, perform Phase 6
  If $D_{neigh} \geq 2,5\ D_m$, perform Phase 7
Phase 5:
  Merge the two cells and optimise
  Perform Phase 8
Phase 6: Optimise the two cells simultaneously
  If the mean distortion of the two cells remains greater than $D_{cell\ max}$, add a median representative and optimise
  Perform Phase 8
Phase 7: Optimise the replenished cell alone and add a representative by splitting if the cell distortion is greater than $D_{cell\ max}$
  Perform Phase 8
Phase 8: If all the replenished representatives have been processed, perform Phase 9
  If not perform Phase 4
Phase 9: Test on the mean distortion $D_m$
  If $D_m$ is below the acceptable distortion threshold, eliminate unused representatives; end of replenishment
  If not, $D_{cell\ max} = D_{cell\ max}/1,1$ and perform Phase 3.

When all the sub-code-books have been replenished, it may be necessary to introduce a step of arbitration before concatenation if the sum of the replenished representatives exceeds the maximum acceptable size of the code-book. It will be noted that the acceptable size of the code-book may be related to the dimensions of the labelling index of the representatives.

Advantageously, the arbitration between the sub-code-books is performed by eliminating the least utilised representatives. However, any suitable and effective arbitration proceedure is possible.

As stressed above, the choice of the method of classifying the vectors is important if it is desired to optimize the coding really, that is to say preserve the best possible image quality under the constraint of limited information bit rate. One of the worthwhile means of performing the classification 13 of FIG. 7 in optimum fashion relative to the adaptive coding process of FIGS. 3 and 5 consists of using grids of analysis of the transformed blocks of the kind shown in FIG. 6B. This drawing represents a set of six classification grids of transformed 4×4 image blocks subjected to the adaptive coding of this embodiment of the invention. It will be recalled that, after orthogonal transformation, each of the sixteen coefficients of a transformed block provides a frequency information, except for the coefficient 65 which provides a "mean" information. The coefficient 65 is processed separately for the reasons set out above.

The grids $A_{upp}$, $A_{Lin}$, $A_{Diag}$, $A_{Low}$ and $A_{Col}$ are used to calculate the "activity" of each transformed image block in a particular zone (right upper corner, first line, diagonal, left corner, first column).

The configuration of these grids has been chosen after experimenting with the psycho-visual distortion attaching to each grid, so that their use enables an optimized classification of the blocks. The set of classes which can be derived from the set of grids thus defined enables optimum adaptation of the sampling by zones, with the constraint that the final dimension of the blocks of each zone has the same value, after sampling. It will be appreciated that the possibility of thus sampling all the blocks of the same class and therefore of eliminating a certain number of their coefficients without causing significant distortion of the received image signal enables a saving in the cost of processing and in the cost transmitting the sub-code-book of the class.

Preferably, the assignment of each block to a class is performed by comparison of the activity of the block in the applied grid (that is to say the activity of the block taking into consideration only the coeffcents located in the non-shaped areas) relative to pre-defined thresholds.

Figure 7:
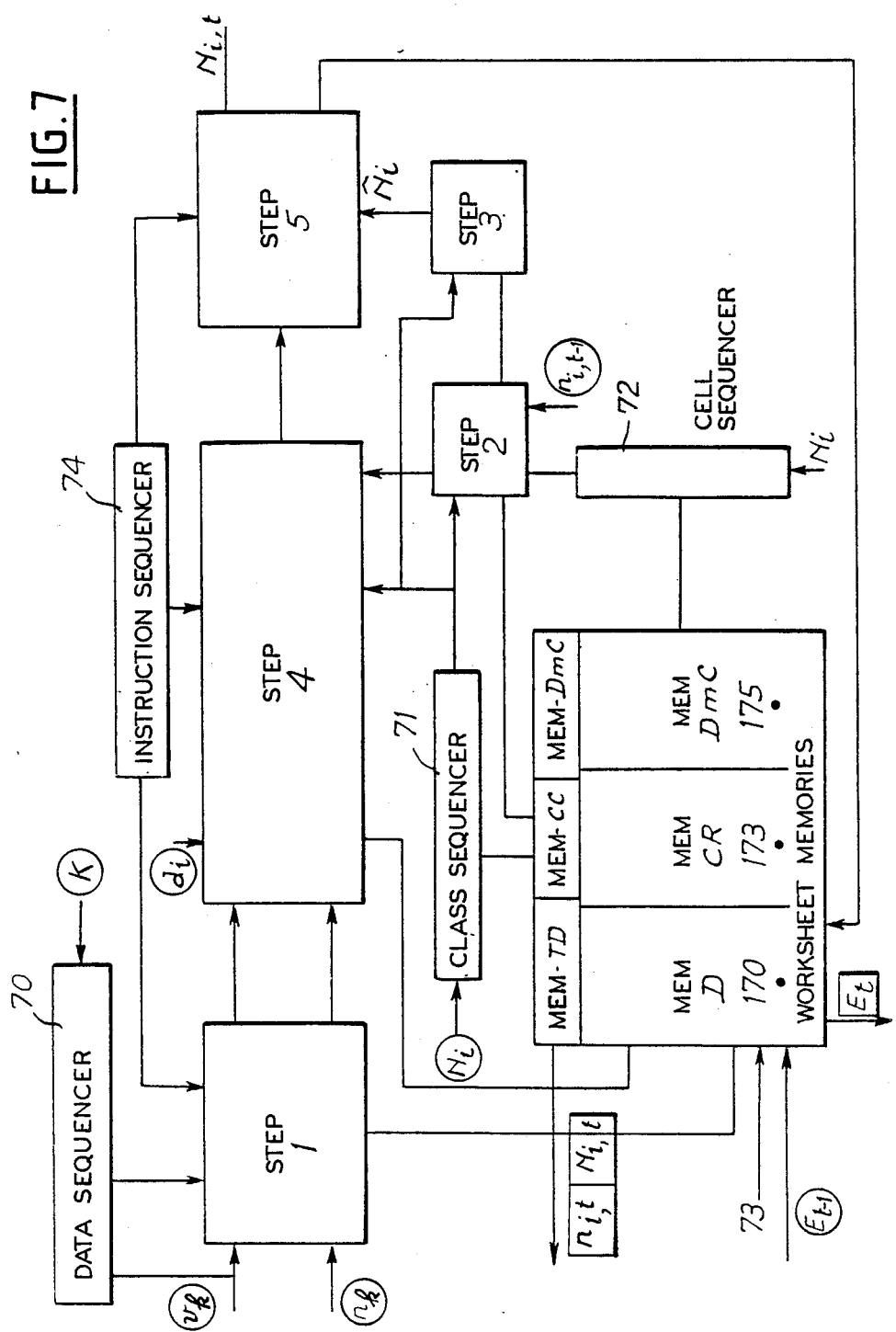
FIG. 7 is a synoptic diagram of apparatus in accordance with an embodiment of the invention, for performing the process of FIG. 3, and showing the connections for transfer of data between the chains of circuits and modules employed to perform each of the steps of FIG. 3.

FIG. 7 is a synoptic diagram of apparatus for performing the process described above showing the connections for data transfer of data between the chains of circuits and modulates employed to perform each of the steps of FIG. 3.

The five steps of the process whose corresponding circuits and modules are shown in detail in FIGS. 8 to 11 (step 2 not being illustrated) are sequenced by means of:

a data sequencer 70 which controls the flow of K input data ($V_k$, $n_k$);

a class sequencer 71, which runs through the $N_c$ classes;

a cell sequencer 71 which runs through the N representatives and associated cells;

an instruction sequencer 74 which sequences the processing. Also, a set of worksheet memories 73 provides a buffer for data between each step.

Each of the chains, circuits and modules for performing steps 1 to 5 will now be described, before narrating the general operation of the apparatus illustrated by the diagram of FIG. 7.

Figure 8:
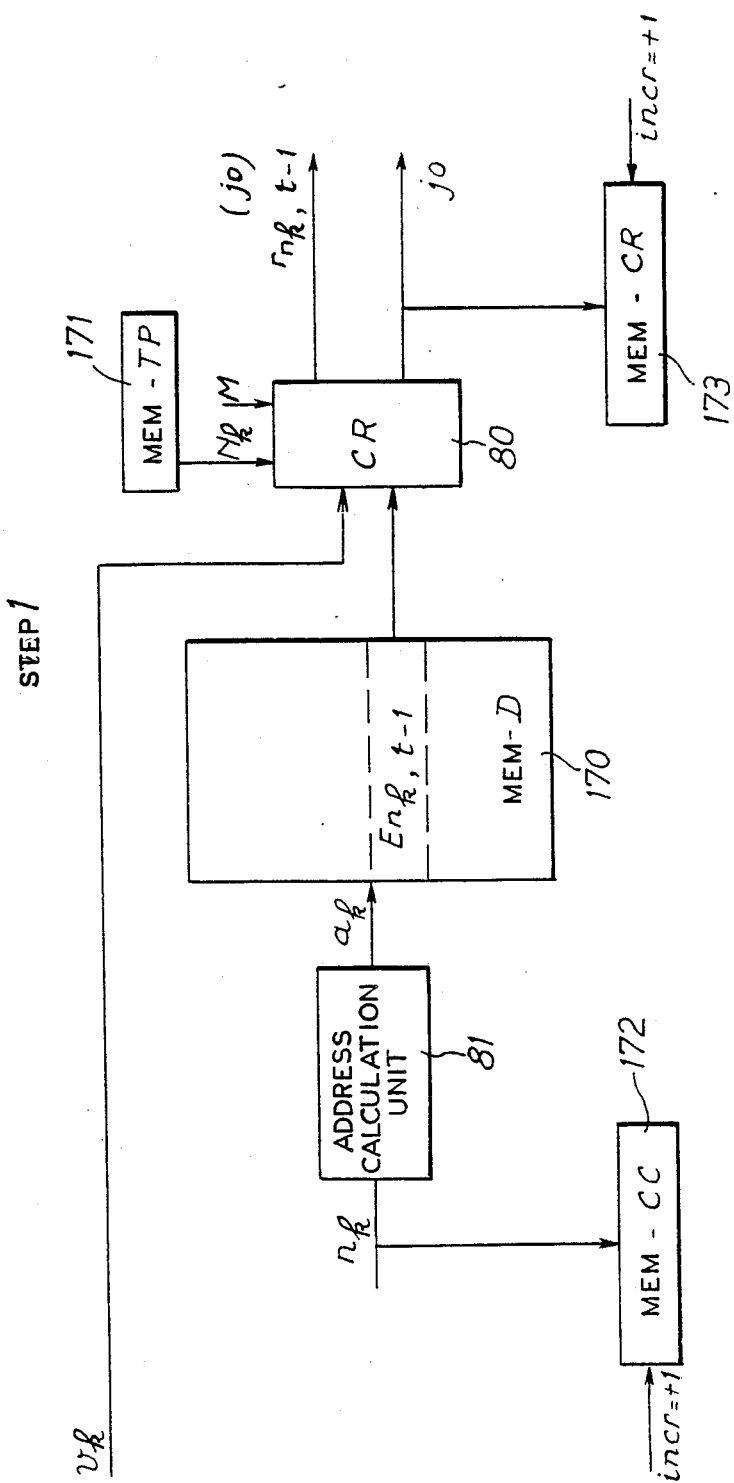
Figure 16:
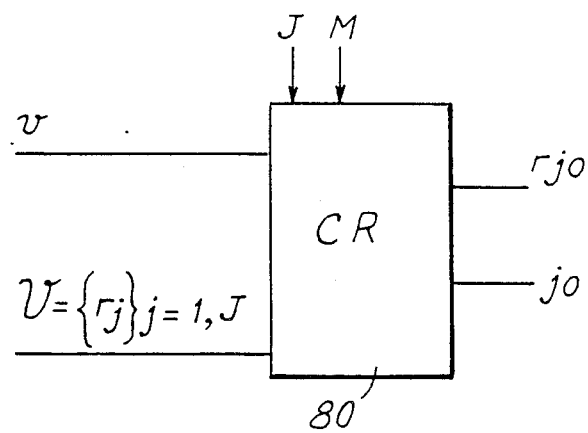
Figure 16:
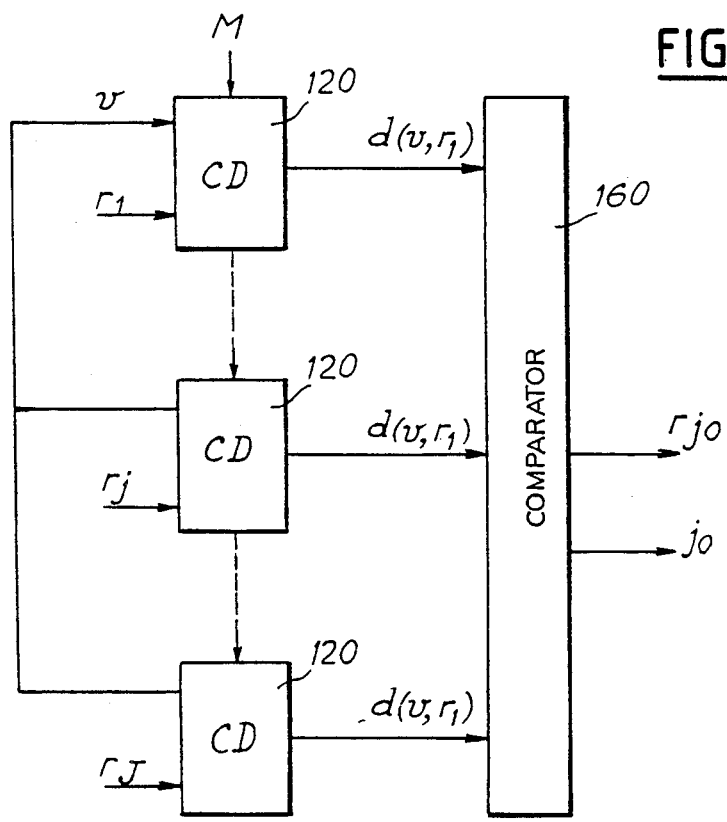

FIG. 8 shows the logic connection for performing step 1 of the process of FIG. 3, consisting of distributing the input data ($V_k$, $n_k$) in the previous partitioning. The vectors $V_k$ are introduced into a module 80 for calculating the representative, as shown in FIG. 16. This module 80 operates in association with a memory MEM-TD171 for storing the size of the sub-code-books $N_k$.

The structure of the module 80 is shown in more detail in FIGS. 16a, 16b. Generally speaking, it will be noted that FIGS. 12 to 16, which show the detailed structure of different modules in the apparatus each show a summarized reminder of the module inputs and outputs (FIGS. 12A, 13A, 14A, 15A, 16A) and then a drawing showing the detailed internal architecture of the modules (FIGS. 12B, 13B, 14B, 15B, 16B).

The module 80 to step 1, as shown in FIG. 16B, comprises distortion calculation modules 120 connected in parallel. The distortion between each input vector V and each representative of the sub-code-book is calculated and a comparator circuit 160 detects the representative offering the least distortion, that is to say the representative of the cell to which the vector V belongs.

The circuit 80 of step 1, as shown in FIG. 8, is also supplied with information of the classification $n_k$ of the vector $V_k$, through an address calculation unit 81 which checks off the address $a_k$ in the memory MEM-D170 storing the sub-code-books.

The circuits and modules of step 1, shown in FIG. 8, also include a memory MEM-CC 172 which counts the occurrence of the representatives and a memory MEM-CR counting the occurrence of the classes. These memories 172 and 173 are incremented by one unit for each calculation of the representative of a new vector $V_k$.

The circuits for performing step 2 are not shown, as these circuits merely read continously the memory MEM-CC 172 once the flow of data ($V_k$, $d_k$) has been processed in step 1. The content of this memory 172 in fact provides the cardinal of the observation set of vectors.

Figure 9:
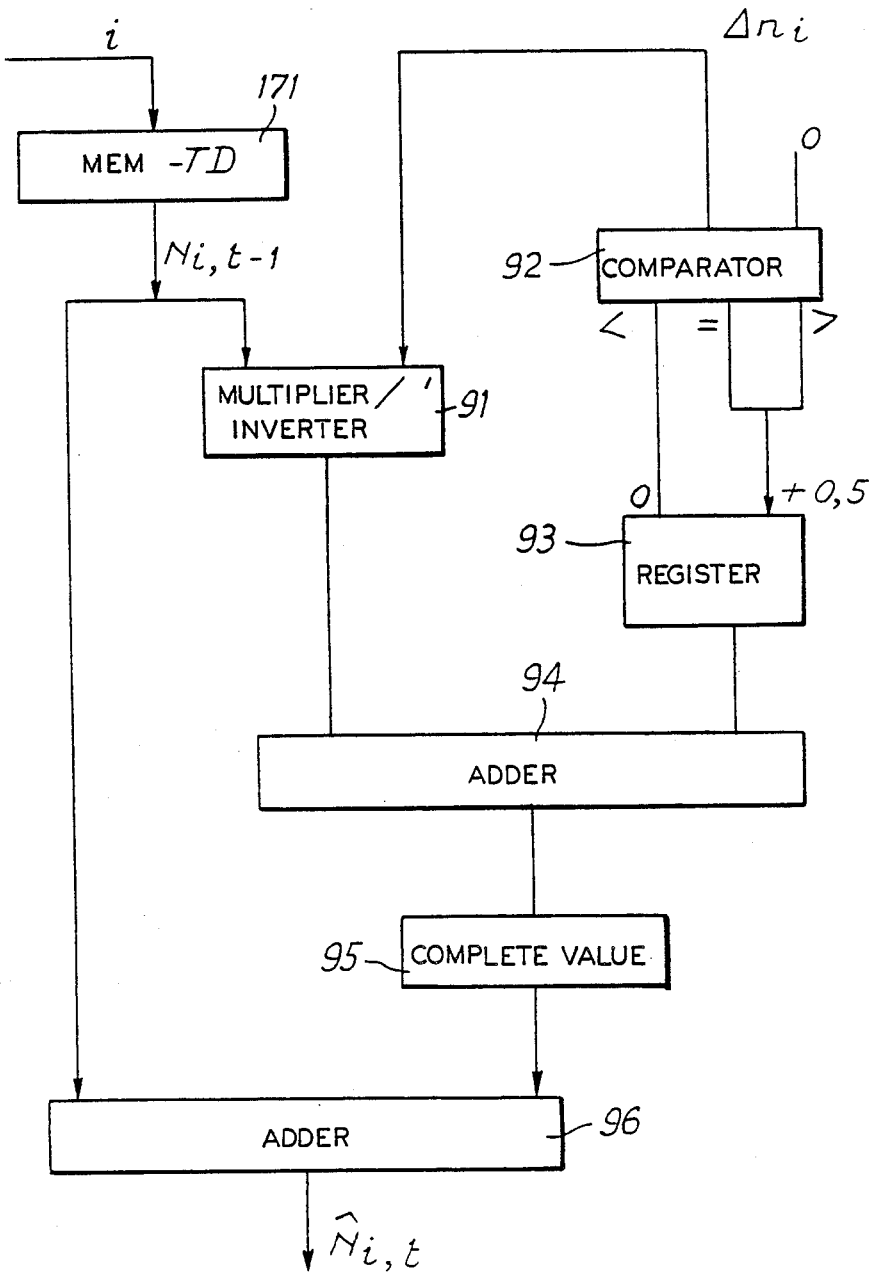

FIG. 9 shows a circuit for performing step 3, consisting of estimating the size of the new sub-code-books working from the observation set of vectors.

The circuits shown correspond to the processing of class i. The information of class i is introduced into a memory MEM-TD 171 which retains the size of the previous sub-code-book of the class. This information is supplied to a multiplier/inverter 91, to which is also fed the value $\Delta n_i$ of the difference between the cardinal of the former sub-code-book and the cardinal of the new one. The value $\Delta n_i$ is also supplied to a comparator circuit 92 which increments a register 93 if the size of the new code-book is greater than or equal to zero.

The multiplier 91 and the register 93 supply an adder 94 followed by a circuit 95 for extracting the complete value of the signal provided by the adder. The size of the new sub-code-book $N_{i,t}$ is supplied by a second adder 96 for adding the output signals of the memory 171 and the circuit 95.

Figure 10:
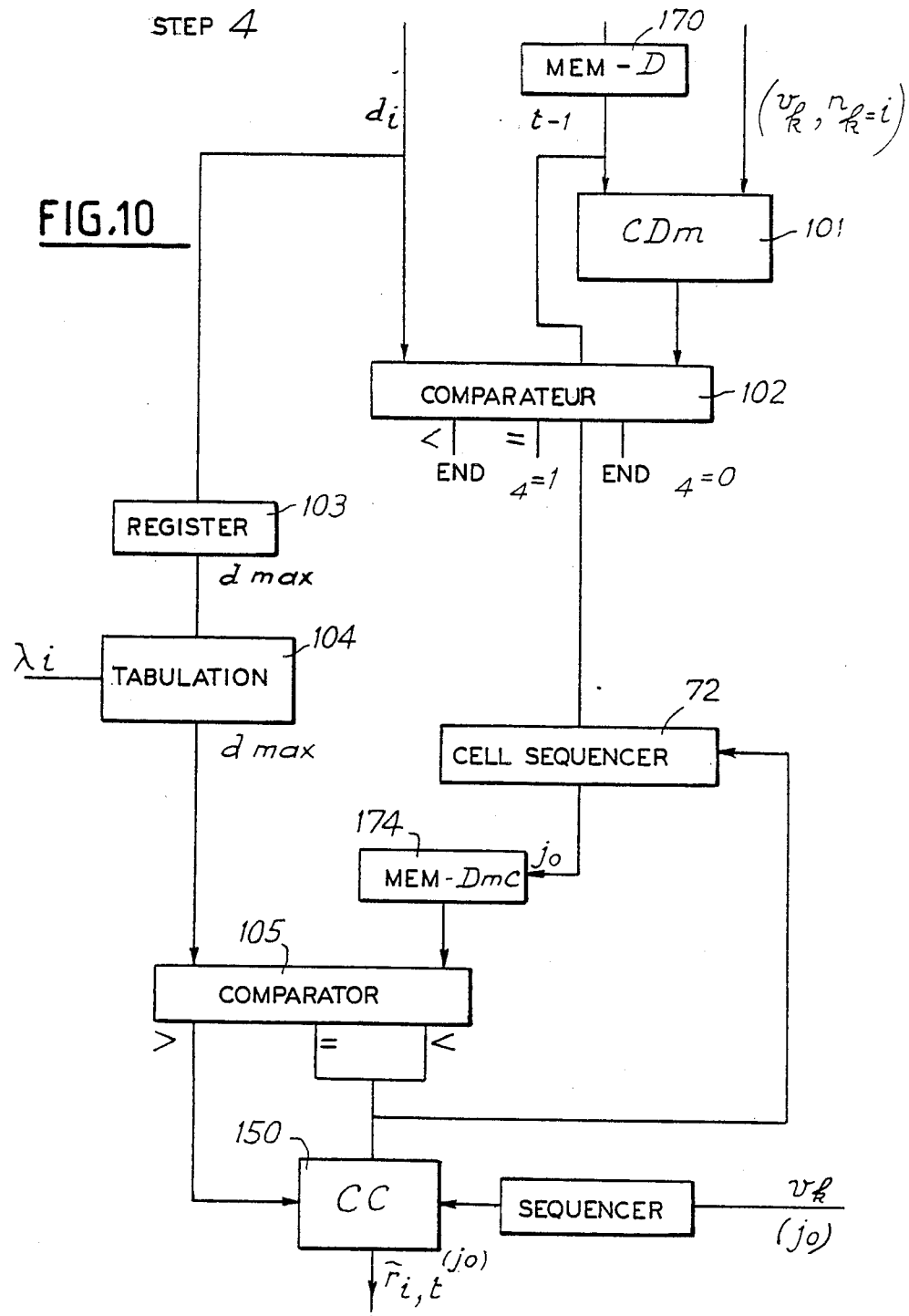
Figure 10:
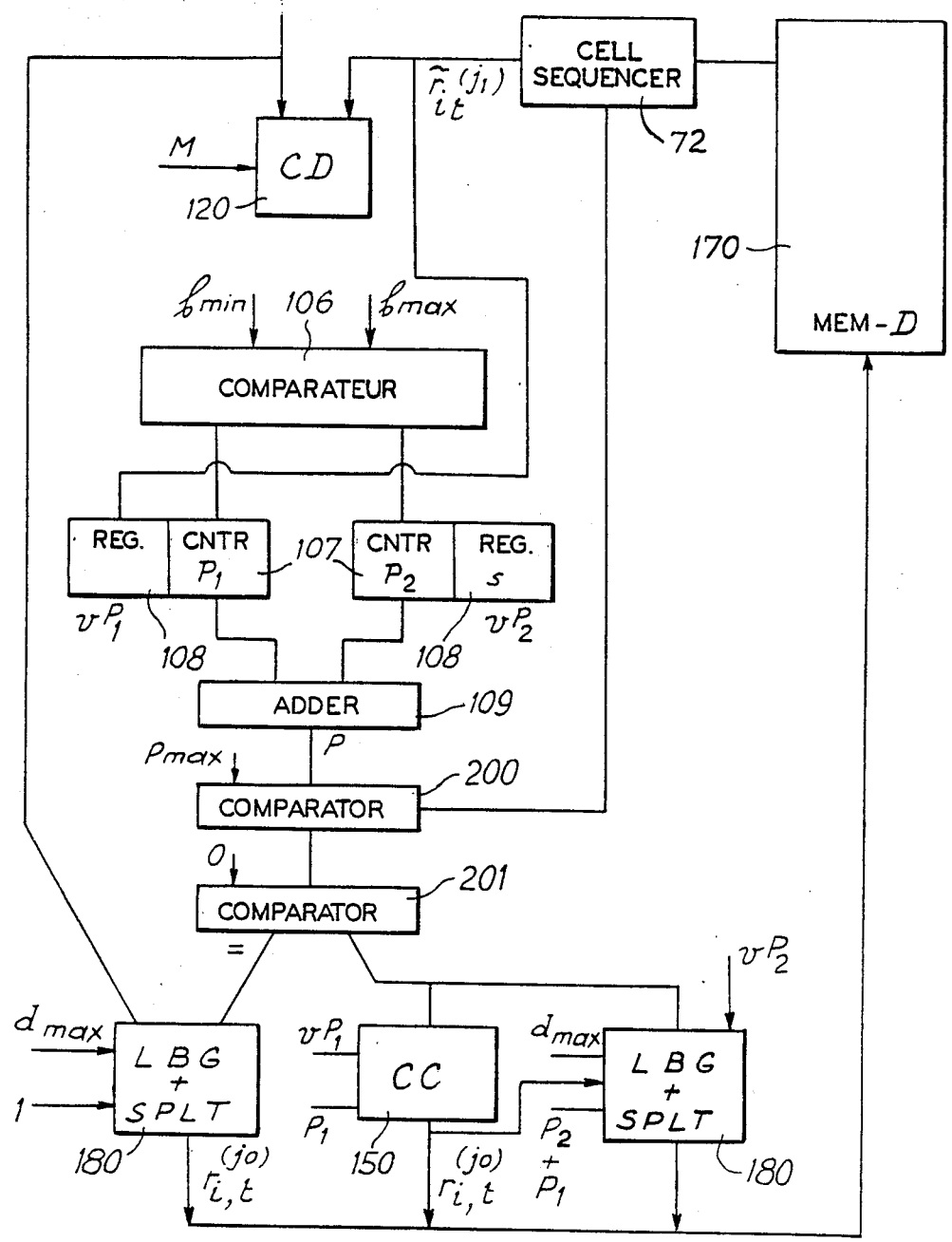

Step 4 is the subject of FIGS. 10 and 10B. This step corresponds to replenishment of the sub-code-book of the class i.

The input data for this step are the value of the maximum acceptable distortion $d_i$, the content of the sub-code-book $E_{i,t-1}$ of the class i, and the observation set of vectors ($V_k$, $n_k$). A circuit 101 first calculates the mean distortion for the whole of the sub-code-book. This circuit 101 is shown in more detail in FIGS. 14a, 14b, and comprises a plurality of distortion calculation circuits 120. Each circuit 120 calculates the distortion between each observation vector and its representative and the whole set of circuits 120 connected in parallel supply an adder circuit 141 followed by a multiplier circuit 142 which provides the information on the mean distortion $d_m$ of the class.

Step 4 of FIG. 10 continues through a comparator circuit which interrupts the process of replenishment in the case of a class mean distortion less than or equal to the maximum acceptable distortion $V_i$.

Otherwise, the cell sequencer 72 is actuated to identify cells whose mean distortion is greater than a maximum distortion $d_{max}$ defined by the register 103 and tabulator 104 in relation with the distortion threshold $d_i$. To this end, a comparator 105 extracts the value of the distortion of each cell stored in the memory MEM-$D_{mc}$ 174 to compare it with the maximum distortion information derived from the tabulator 104.

The output of the comparator 105 corresponding to a positive test result is connected to the input of a module 150 for replenishing the representative of the selected cell. The circuit 150 is shown in more detail in FIG. 15B and comprises a plurality of adders 151 supplied with the coefficients of different orders for all the vectors of the cell and a plurality of multipliers 152 which provide the new value of the coefficient of corresponding order for the new representative vector.

Each new representative is then supplied to a distortion calculation circuit 120, as shown in FIG. 10B. The output of the distortion calculator 120 is connected to the input of a comparator 106 which explores the "close" and "very close" neighbourhoods for the selected cell, in cooperation with two counters 107 and two registers 108, the limitation of the operation of exploration being defined by an adder 109 and comparator 200.

A comparator 201 then directs the processing towards either a replenishment circuit 180a for applying the LBG algorithm and splitter techniques (case of no representative being identified in the close neighbourhood of the cell) or circuits 150 and 180 for re-calculating the centroid of the merged cell and repartitioning the neighbourhood by LGB algorithm and splitter techniques respectively.

Figure 18:
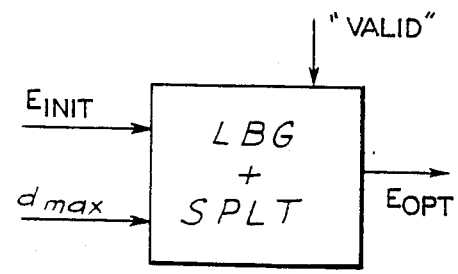
FIG. 18 is a diagram of a module for replenishment by LBG algorithm and splitter techniques shown in FIG. 10B.

The corresponding module 180 is represented in FIG. 18. In the general case of use of the module, the inputs comprise the initial code-book (or a fraction thereof) $E_{init}$, a maximum acceptable distortion threshold $D_{max}$ forming a halt criterion and a trigger order "valid". The output comprises the replenished code-book (or fraction thereof), $E_{opt}$.

The calculated new representatives are supplied to the memory MEM-D 170 storing the representative vectors.

Figure 11:
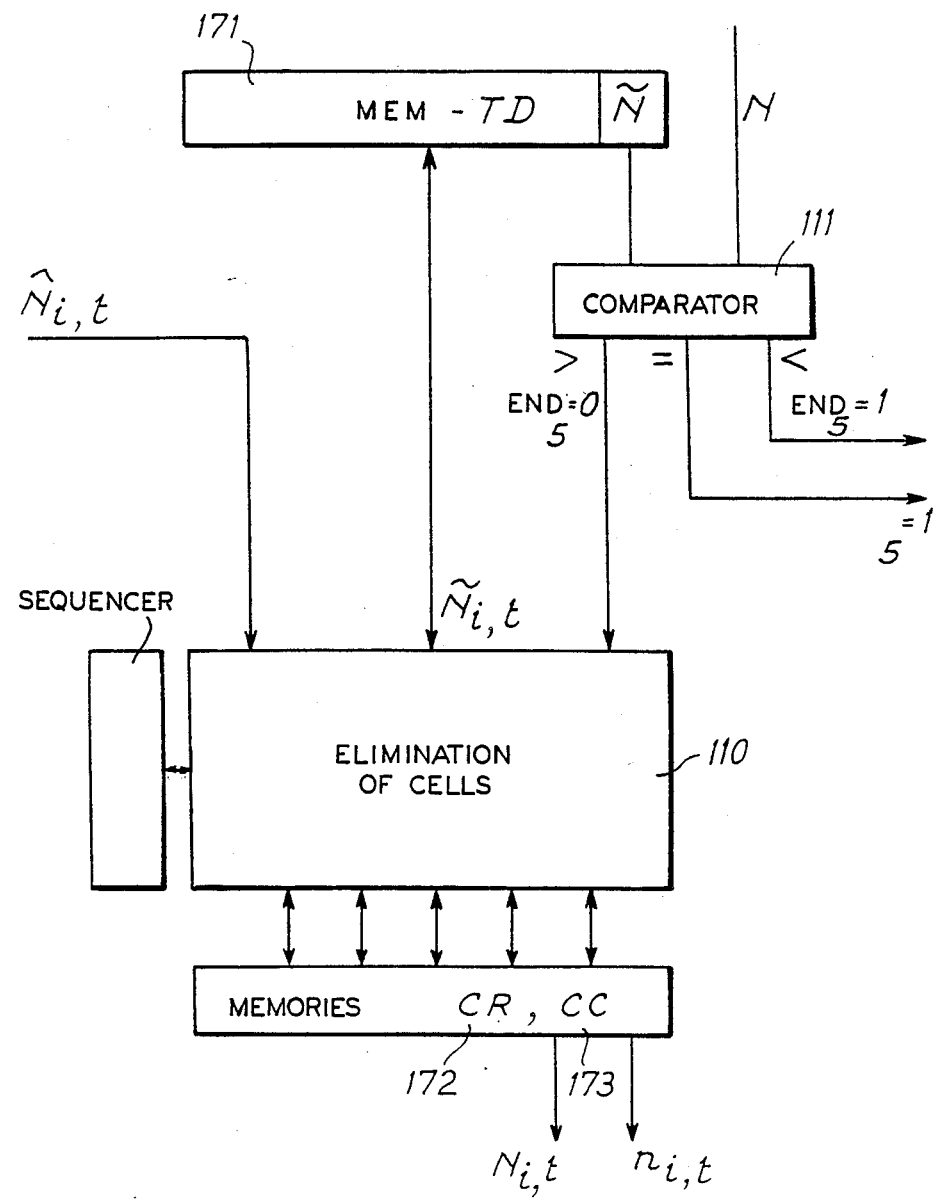

Step 5 is the subject of FIG. 11. It is performed with the aid of a module for suppressing cells 110, controlled by a sequencer and connected to the memory MEM-TD 171. The cell elimination module 110 operates in cooperation with the memories CR+CC 172, 173 which supply information of the occurrence of classes and representatives respectively.

A comparator 111 interrupts the replenishment process when the cardinal of the new concatenated code-book has come back within the thresholds N.

Figure 12:
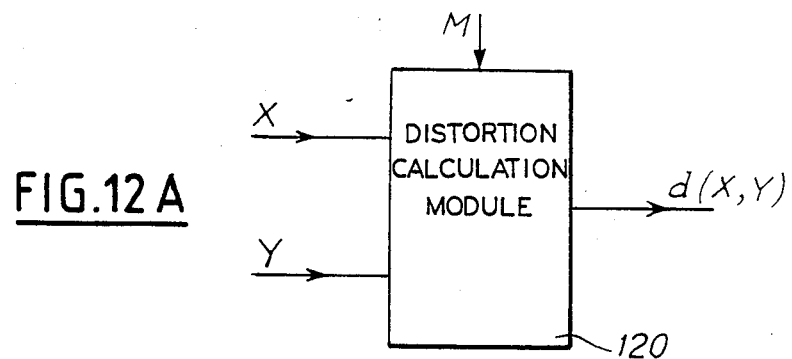
FIGS. 12 to 17 are diagrams showing details of parts of the modules of FIGS. 8 to 11.
Figure 12:
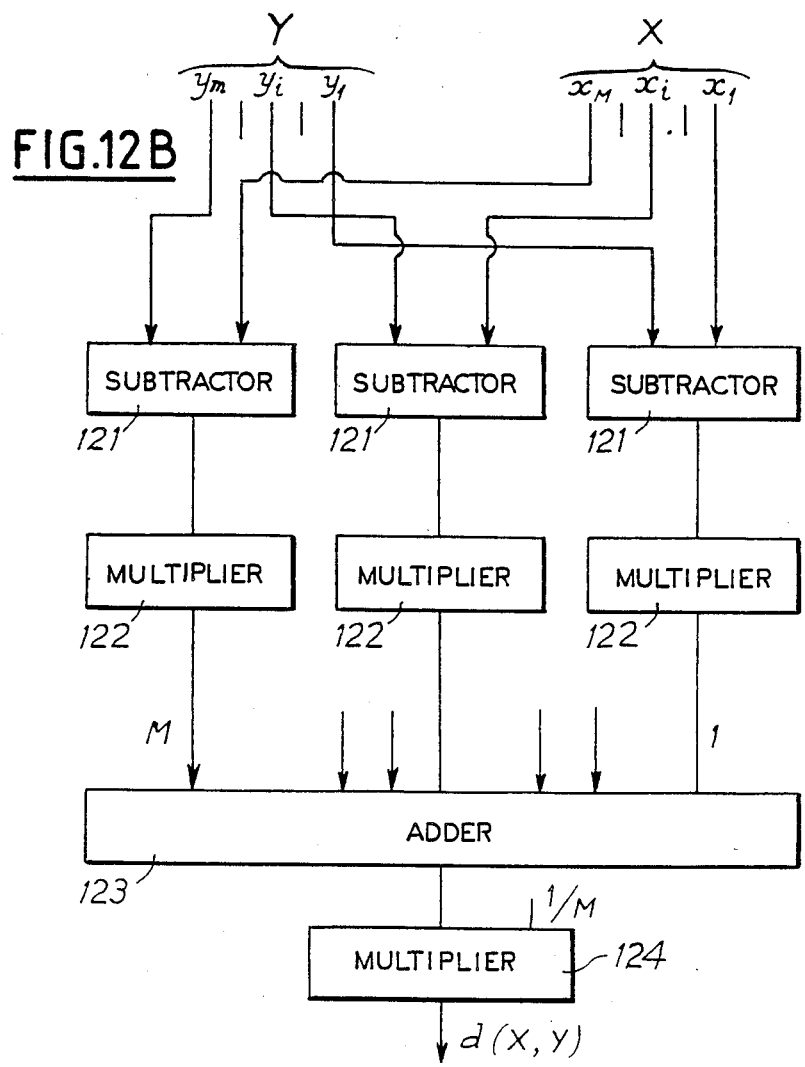

FIG. 12 shows an embodiment of the distortion calculation modules 120 used in steps 1 and 4. Each of these modules comprises subtracters 121 connected in parallel, with their outputs connected to respective multipliers 122. All the multipliers supply an adder 122 connected to a multiplier 124 which produces the value of the distortion between the two vectors X and Y.

Figure 13:
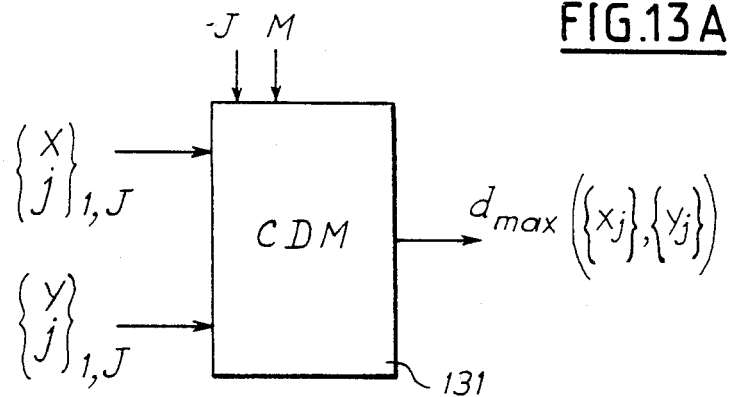
Figure 13:
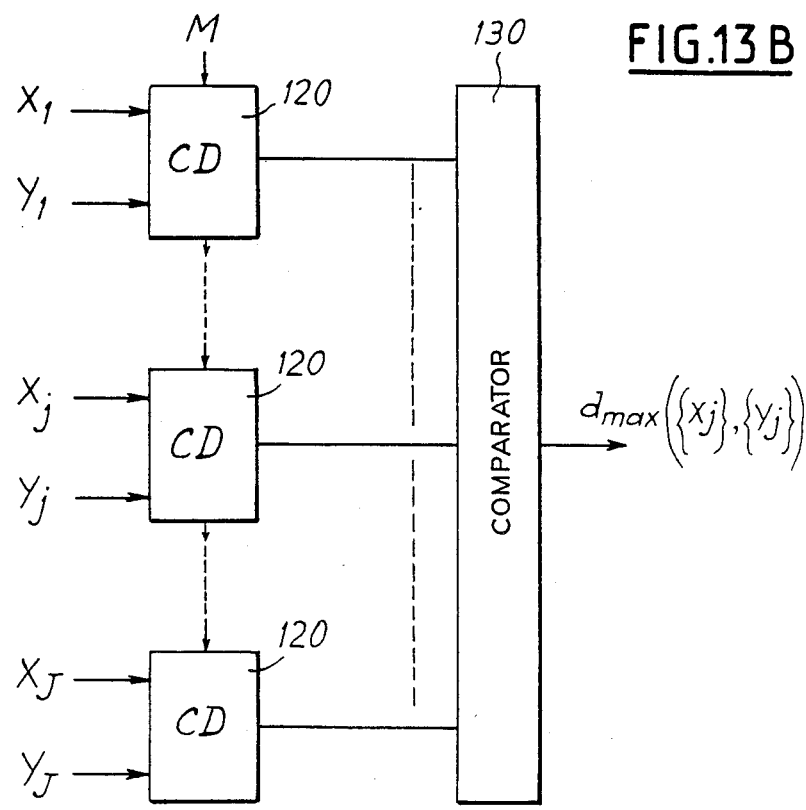
Figure 14:
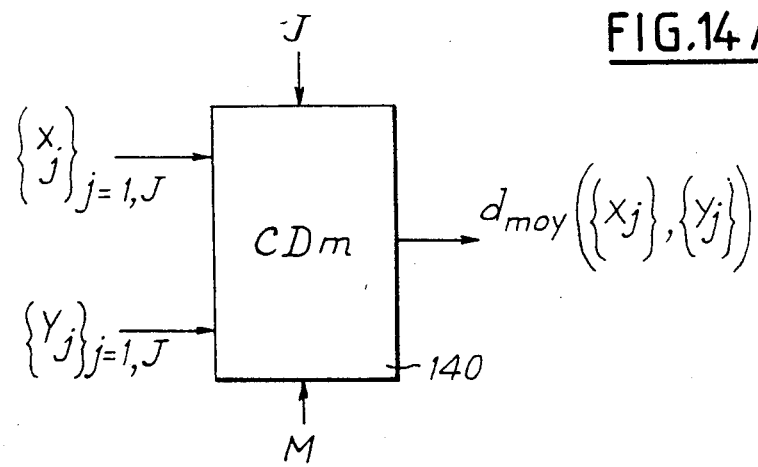
Figure 14:
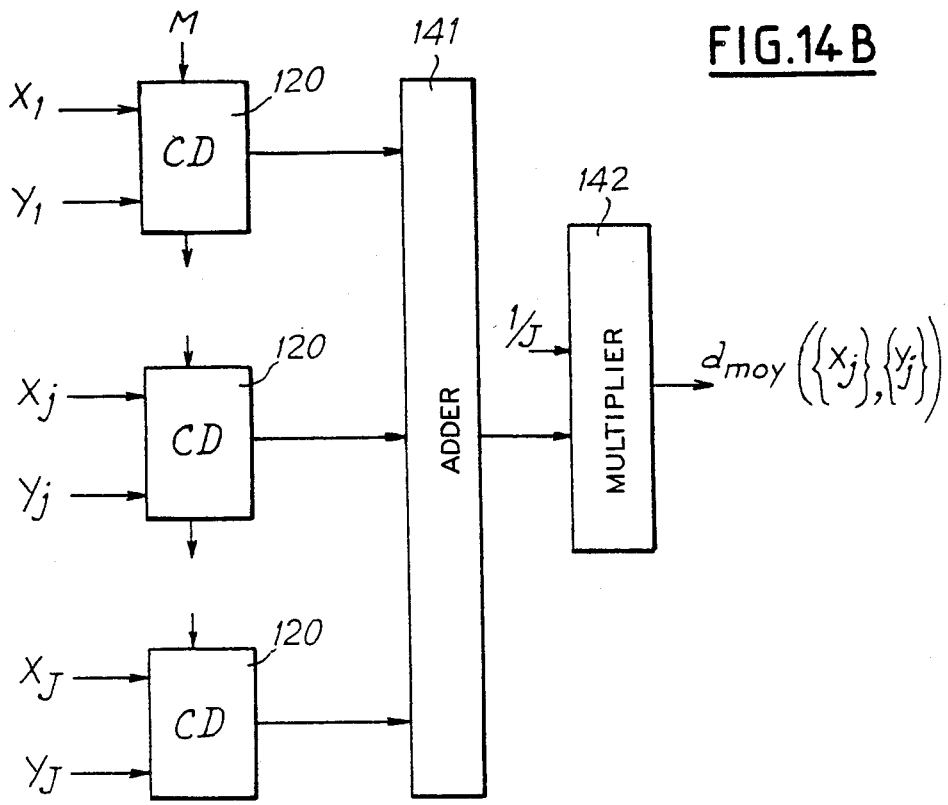
Figure 15:
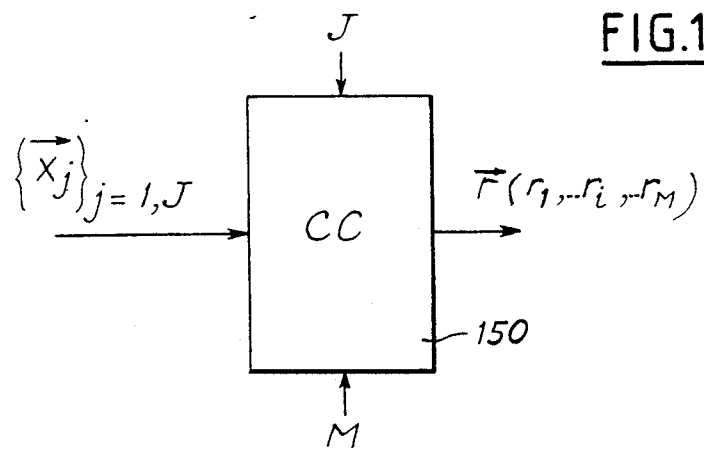
Figure 15:
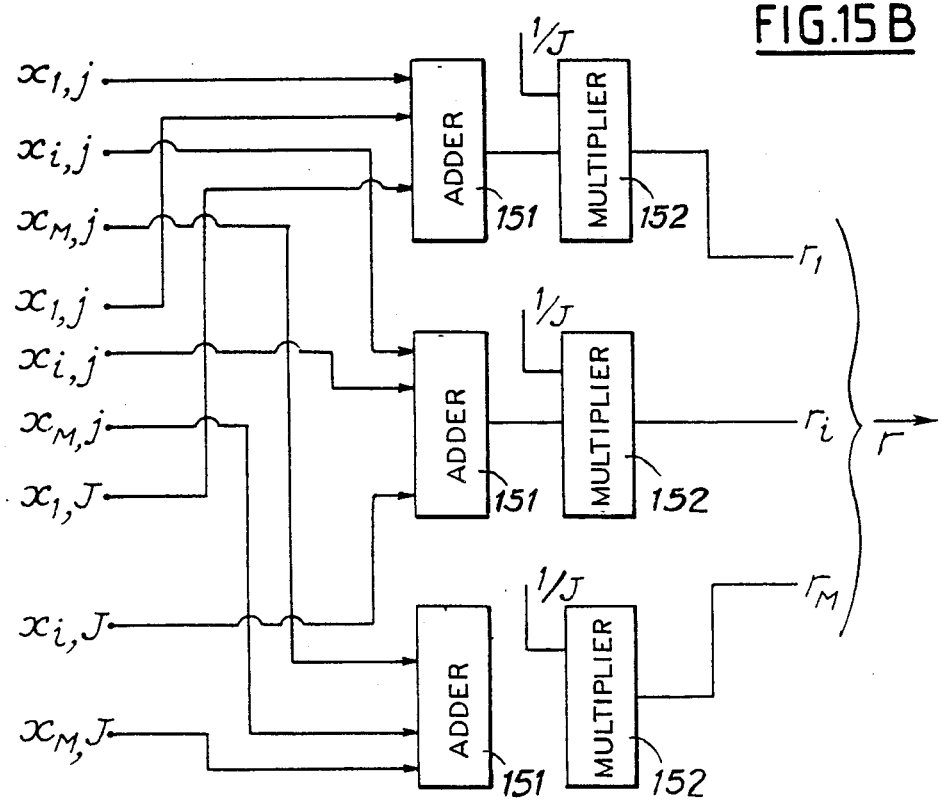

FIG. 13 shows a maximum distortion calculation module 131 usable to identify and select a high distortion cell. This module comprises a plurality of distortion calculation modules 120 connected in parallel and supplying a comparator 13 whose output is the value of maximum distortion sought.

Figure 17:
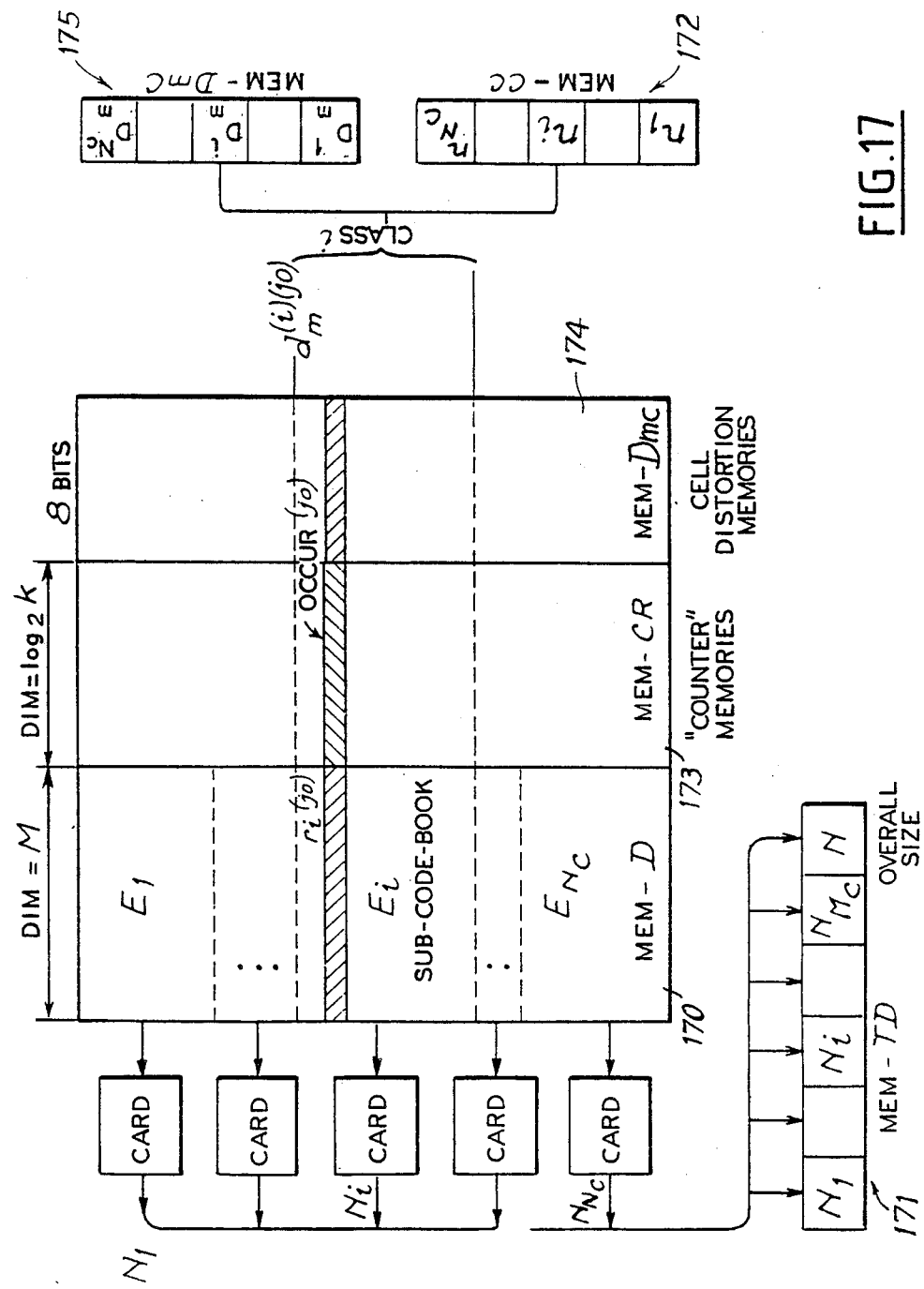

FIG. 17 illustrates the partitioning of the memory MEM-D 170, which stores the code-book E formed by the concatenation of the sub-code-book $E_i$.

Each representative vector $r_i$, $j_o$ belonging to the class i and stored in the memory MEM-D 170 has associated with it an occurrence value equivalent to the number of utilizations of the representative vector for the flow of input data ($V_k$, $n_k$). These occurrence values are produced by counting, as mentioned with reference to FIG. 8, and are stored in the memory MEM-CR 173, which is of size N, identical to the size of the complete code-book E.

The occurrence of the classes for the flow of input data is memorized, as mentioned above, in the memory MEM-CC 172.

The memory MEM-TD stores the size of each sub-code-book $E_i$, and the size of the complete concatenated code-book N.

Lastly, the memories MEM-$D_{mc}$ and MEM-$D_{mc}$ store the mean distortion values for each cell and each class. As noted above, the calculation of mean distortions is performed taking account of the occurrence values of the representatives and classes stored in MEM-CR 173 and MEM-CC 172.

It will be noted that in the context of usage of the process in an encoding-decoding scheme, of the kind shown in FIG. 1, only the memory 170 is present in the decoder, the others only being required for the replenishment process performed upstream of the transmission channel in the encoder.

An example of application of the adaptive coding process in accordance with this embodiment of the invention has been performed on a sequence of images.

The process was performed using transformation of each image by "Discrete Cosine Transform" (DCT) on 4×4 square image blocks. The dimension used for the vectors was 15 and the number of observation vectors at the input: K=11,256, which is one image frame decomposed into 4×4 blocks.

The blocks are distributed into 17 classes and the size of the overall code-book was limited to N=4096 (expressible in words of 12 eb).

The values of distortion chosen for the classes were:
11 for class 1;
16 for classes 5, 7, 9 and 11;
49 for the other classes.

The parameters for performing step 4 were:
calculation of each new distortion threshold $d_{max}$ = $d_{max}$/1,1, with an initialisation at $d_{max}$=4$d_i$;
$P_{max}$=1 (exploration of the neighbourhood of each selected cell limited to the single closest representative);
the values of the radii $f_{min}$ and $f_{max}$ of the exploration sphere centred on the representative of each selected cell were $d_i$ and 2,5$d_i$ respectively.

The simulations were performed on a VAX 11/750 mini-computer provided with a vectorial processor. This computer had a calculation speed of 0.7 MIPS (megainstructions of program per second).

The replenishment processing of the code-book E on a frame of the sequence processed ("Car" sequence) was performed on average in 1.5 minutes. Table 2 presents the coding results by class for coding the first frame of the images 1, 10, 20 and 30 of the sequence. The figures presented in the columns correspond successively to the number of the class, the image considered, the population of each class in the image t compared to the image t−1, the number of representatives replenished, the size of the code-book, and the mear and maximum distortions observed in the class.

It will be noted that in the simulations made, no notion of parallelism of the processings was introduced, neither concerning parallel management of each class, not sequencing nor replenishing of the cells. There therefore exists a considerable margin for time saving relative to the calculation observed.

Moreover, by using binary branching procedures for representative search and perhaps cascade vector quantization, an apparatus can be made in cabled form enabling sampling frequencies to be followed of close to 13.5 MHz, corresponding to current standards in digital television.

TABLE 2

RESULTS OF CODING ON AN IMAGE SEQUENCE ("CAR" SEQUENCE)

| Class | Image t (Frame t) | No Blocks (t-1)/t | No Reps. replen. | Code-book size t-1/t | $D_{mean}$ ss/bef. rep. | $D_{max}$ ss/bef. rep. |
|---|---|---|---|---|---|---|
|   | voht   | —/1497    | —  | —/2     | 23/—   | 83/—     |
|   | voht10 | 1552/1568 | 0  | 2/2     | 23/23  | 77/77    |
|   | voht20 | 1659/1680 | 0  | 2/2     | 22/22  | 79/79    |
|   | voht30 | 756/1792  | 0  | 2/2     | 22/22  | 85/85    |
| 2 | 1      | —/77      | —  | —/32    | 37/—   | 105/—    |
|   | 10     | 91/84     | 15 | 29/30   | 84/45  | 203/134  |
|   | 20     | 59/66     | 14 | 29/28   | 84/45  | 172/160  |
|   | 30     | 81/87     | 18 | 31/31   | 91/44  | 184/123  |
| 3 | 1      | —/55      | —  | —/43    | 36/—   | 191/—    |
|   | 10     | 67/60     | 31 | 48/49   | 355/30 | 2713/204 |
|   | 20     | 51/55     | 34 | 41/50   | 524/37 | 8021/207 |
|   | 30     | 1/46      | 22 | 49/35   | 398/49 | 2309/259 |
| 4 | 1      | —/16      | —  | —/16    | 0/—    | 0/—      |
|   | 10     | 20/17     | 2  | 7/5     | 77/47  | 152/107  |
|   | 20     | 10/16     | 2  | 4/6     | 91/37  | 197/85   |
|   | 30     | 25/13     | 6  | 8/7     | 72/20  | 106/33   |
| 5 | 1      | —/274     | —  | —/120   | 40/—   | 195/—    |
|   | 10     | 317/316   | 80 | 143/133 | 130/45 | 1150/202 |
|   | 20     | 314/327   | 89 | 139/145 | 131/41 | 1034/149 |
|   | 30     | 255/358   | 91 | 126/138 | 138/45 | 317/176  |
| 6 | 1      | —/103     | —  | —/16    | 42/—   | 102/—    |

TABLE 2-continued
RESULTS OF CODING ON AN IMAGE SEQUENCE ("CAR" SEQUENCE)

| Class | Image t (Frame t) | No Blocks (t-1)/t | No Reps. replen. | Code-book size t-1/t | $D_{mean}$ ss/bef. rep. | $D_{max}$ ss/bef. rep. |
|---|---|---|---|---|---|---|
|   | 10 | 106/83 | 8 | 22/18 | 62/47 | 193/96 |
|   | 20 | 92/94 | 8 | 26/21 | 58/47 | 140/103 |
|   | 30 | 74/76 | 5 | 20/17 | 56/49 | 113/107 |
| 7 | 1 | —/948 | — | —/426 | 43/— | 356/— |
|   | 10 | 916/911 | 249 | 453/444 | 141/41 | 3489/281 |
|   | 20 | 896/859 | 242 | 452/421 | 145/40 | 2036/247 |
|   | 30 | 845/836 | 230 | 393/409 | 149/40 | 2575/253 |
| 8 | 1 | —/10 | — | —/10 | 0/— | 0/— |
|   | 10 | 4/5 | 3 | 4/5 | 268/0 | 374/0 |
|   | 20 | 3/2 | 2 | 5/3 | 253/0 | 312/0 |
|   | 30 | 2/2 | 1 | 2/2 | 37/0 | 367/0 |
| 9 | 1 | —/16 | — | —/16 | 0/— | 0/— |
|   | 10 | 20/25 | 10 | 17/18 | 531/42 | 1155/127 |
|   | 20 | 16/17 | 11 | 15/15 | 1095/23 | 3395/177 |
|   | 30 | 25/11 | 12 | 22/11 | 758/0 | 1402/0 |
| 10 | 1 | —/3418 | — | —/128 | 50/— | 167/— |
|   | 10 | 3412/3379 | 26 | 171/175 | 50/48 | 165/162 |
|   | 20 | 3394/3463 | 0 | 156/152 | 49/49 | 165/165 |
|   | 30 | 3516/1458 | 0 | 158/155 | 49/49 | 163/163 |
| 11 | 1 | —/1217 | — | —/785 | 40/— | 248/— |
|   | 10 | 1162/1214 | 468 | 753/749 | 274/44 | 6474/275 |
|   | 20 | 1150/1134 | 437 | 764/716 | 245/43 | 4786/226 |
|   | 30 | 1117/1079 | 426 | 713/681 | 274/42 | 5705/183 |
| 12 | 1 | —/124 | — | —/4 | 47/— | 128/— |
|   | 10 | 142/134 | 0 | 7/7 | 43/43 | 113/113 |
|   | 20 | 122/116 | 0 | 6/6 | 48/48 | 149/149 |
|   | 30 | 129/127 | 0 | 6/6 | 45/45 | 93/93 |
| 13 | voht1 | —/341 | — | —/213 | 23/— | 276/— |
|   | voht10 | 369/341 | 88 | 157/169 | 141/48 | 139/147 |
|   | voht20 | 375/238 | 76 | 139/131 | 141/144 | 2468/183 |
|   | voht30 | 394/347 | 100 | 114/147 | 166/40 | 2798/150 |
| 14 | 1 | —/347 | — | —/16 | 43/— | 161/— |
|   | 10 | 332/349 | 0 | 18/18 | 47/47 | 163/163 |
|   | 20 | 344/334 | 0 | 18/18 | 47/47 | 136/136 |
|   | 30 | 347/329 | 0 | 19/19 | 46/46 | 156/156 |
| 15 | 1 | —/989 | — | —/441 | 46/— | 235/— |
|   | 10 | 979/939 | 244 | 476/428 | 176/48 | 3036/269 |
|   | 20 | 984/930 | 263 | 479/436 | 179/46 | 2444/189 |
|   | 30 | 967/936 | 278 | 458/441 | 192/46 | 2826/276 |
| 16 | 1 | —/756 | — | —/128 | 46/— | 141/— |
|   | 10 | 784/796 | 87 | 222/209 | 65/47 | 185/150 |
|   | 20 | 776/785 | 99 | 211/214 | 69/46 | 190/165 |
|   | 30 | 777/769 | 102 | 212/214 | 69/46 | 190/150 |
| 17 | 1 | —/1078 | — | —/717 | 43/— | 390/— |
|   | 10 | 987/1040 | 444 | 689/721 | 290/43 | 5772/295 |
|   | 20 | 1012/1033 | 497 | 754/762 | 296/34 | 6084/222 |
|   | 30 | 1009/995 | 460 | 716/711 | 318/39 | 4494/218 |

Total Replenishment
Car 10: 1750 representatives
Car 20: 1774 representatives
Car 30: 1751 representatives
Overall Code-book size
Car 10: 3170 representatives
Car 20: 3126 representatives
Car 30: 3024 representatives

We claim:

1. A process for adaptive coding of a digital signal having a plurality of components by vector quantization, to produce a high quality coded signal under the constraint of a limited information bit rate, comprising partitioning into cells the space of possible states of the components of the digital signal, choosing a single representative for each cell, substituting for each component of the signal the representative of the cell to which it belongs, the set of representatives resulting from the partitioning forming a code-book, and locally replenishing the code-book, the replenishment comprising the steps of:

a. selecting cells for which coding of a new set of signal components using the current code-book produces a distortion exceeding a certain threshold;

b. analyzing the content and occurrence of use of the code-book using the new set of signal components in each cell thus selected as well as in a neighbourhood of said selected cell wherein said neighbourhood includes a set of interdependent cells andf urther includes at least one neighbouring cell of said selected cell, and c. reconfiguring the local partitioning of said neighbourhood of said selected cell by defining one or more new representatives for said set of interdependent cells.

2. The process of claim 1, wherein said step of analyzing the neighbourhood of the selected cell comprises distinguishing a very close neighbourhood (immediate proximity) and a close neighbourhood (simple proximity), and said step of reconfiguring comprises merging all the cells in said very close neighbourhood with a re-calculation of a new common representative, and replenishing interdependently all the cells of said close neighbourhood, including the merged cell.

3. The process of claim 2, wherein said interdependent replenishment of all the cells of the close neighbourhood, including the merged cell, is performed using an LBG algorithm and/or techniques of splitting the cells.

4. The process of claim 1, wherein said vector quantization is a multiclass vector quantization and wherein said code-book comprises a concatenation of sub-code-books, each sub-code-book corresponding to a respective class and wherein replenishment of the code-book is performed by parallel replenishment of said sub-code-books.

5. The process of claim 4, wherein the size of the concatenated code-book is fixed, and wherein the adaptive coding process includes a set of arbitrations between the sizes of the sub-code-books, including suppression of little-used cell representatives.

6. The process of claim 1, wherein said selection of high distortion cells is performed relative to a maximum acceptable distortion threshold which is reduced iteratively until an acceptable mean distortion for the whole code-book or sub-code-book is obtained.

7. The process of claim 4, wherein no replenishment is performed on sub-code-books whose mean distortion is lower than acceptbale distortion threshold.

8. The process of claim 2, wherein said analysis of the neighbourhood of each selected cell comprises identifying the P first representative situated in a sphere centered on the representative of the merged cell having a radius equal to a maximum acceptable distortion $f_{max}$, then distinguishing among said P representatives the Pl representatives contained in a sphere of radius $f_{min}$ ($f_{min} < f_{max}$), said P1 representatives defining said very close neighbourhood and the other P representatives other than the P1 representatives defining said close neighbourhood.

9. The process of claim 4 applied to coding a digital television image signal, wherein
said image signal is decomposed into blocks of 4×4 pixels,
said blocks are pre-processed by orthogonal transformation of a Cosine Transform type,
said transformed blocks are distributed into classes by means of grids for analyzing their activity,
the classified transformed blocks are zone sampled, wherein classification and sampling of the blocks is performed using criteria corresponding to empirical psycho-visula distortion criteria, and
the blocks are vector-quantized with separate replenishment of the sub-code-books of each class.

10. The process of claim 9 applied to code an interlaced frame digital image signal, wherein specific sub-code-books are assigned to odd and even frames respectively.

11. A process for transmitting a digital signal comprising:
a process for adaptive coding of a digital signal having a plurality of components by vector quantization, to produce a high quality coded signal under the constraint of a limited information bit rate, comprising partitioning into cells the space of possible states of the components of the digital signal, choosing a single representative for each cell, substituting for each component of the signal the representative of the cell to which it belongs, the set of representatives resulting from the partitioning forming a code-book, and locally replenishing the code-book, the replenishment comprising the steps of;
a. selecting cells for which coding of a new set of signal components using the current code-book produces a distortion exceeding a certain threshold;
b. analyzing the content and occurrence of use of the code-book using the new set of signal components in each cell thus selected as well as in a neighbourhood of said selected cell wherein said neighbourhood includes a set of interdependent cells and further includes at least one neighbouring cell of said selected cell, and
c. reconfiguring the local partitioning of said neighbourhood of said selected cell by defining one or more new representatives for said set of interdependent cells;
transmitting an initial code-book prior to transmitting a useful signal,
memorizing said initial code-book at the receiver,
periodically replenishing said code-book using at least certain of the new sequences of the digital input signal and,
after each periodic replenishment, transmitting selectively to the receiver the information for replenishment of the receiver code-book.

12. The process of claim 11, applied to the transmission of digital television image signals, wherein said code-book is replenished for each new image signal frame, said replenishment information being transmitted prior to the transmission of the image information for the corresponding frame.

13. The process of claim 11, wherein said initial code-book is transmitted in the form of the values of each representative accompanied by a label addressing the representative in the code-book, transmission of each coded sequence of the useful signal comprising transmitting the label of the representative of each component of the useful signal, and the transmission of replenishment information comprising the transmission of the new representatives accompanied by their labels addressing them in the code-book.

14. The process of claim 13, wherein the transmission of replenishment information also comprises transmitting the labels of eliminated representatives.

15. A method for transmitting digital signals comprising the steps of:
decomposing a digital input signal into blocks;
transforming said blocks;
image classifying said transformed blocks; and
adaptively coding said image classified signal, wherein said adaptively coding comprises the steps of
comparing a distortion value associated with a class of signals to a predetermined value; and
modifying a code-book for translating said coded signal if said distortion value exceeds said predetermined value wherein said step of modifying comprises,
identifying individual cells of said class of signals having a distortion value greater than a second distortion threshold and,
modifying a set of cells associated with each of said individual cells identified wherein said modification revises said code-book.

* * * * *